US010249589B2

(12) United States Patent
Yajima et al.

(10) Patent No.: US 10,249,589 B2
(45) Date of Patent: Apr. 2, 2019

(54) SEMICONDUCTOR DEVICE INCLUDING CONDUCTIVE LAYER AND CONDUCTIVE PILLAR DISPOSED ON CONDUCTIVE LAYER AND METHOD OF MANUFACTURING THE SAME

(71) Applicant: Renesas Electronics Corporation, Tokyo (JP)

(72) Inventors: Akira Yajima, Hitachinaka (JP); Yoshiaki Yamada, Hitachinaka (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/582,277

(22) Filed: Apr. 28, 2017

(65) Prior Publication Data

US 2017/0373031 A1 Dec. 28, 2017

(30) Foreign Application Priority Data

Jun. 28, 2016 (JP) ................................. 2016-127210

(51) Int. Cl.
*H01L 23/00* (2006.01)
*H01L 23/29* (2006.01)
(Continued)

(52) U.S. Cl.
CPC ............ *H01L 24/13* (2013.01); *H01L 21/311* (2013.01); *H01L 21/321* (2013.01); *H01L 21/56* (2013.01); *H01L 23/293* (2013.01); *H01L 23/3157* (2013.01); *H01L 23/3192* (2013.01); *H01L 23/525* (2013.01); *H01L 23/53295* (2013.01); *H01L 24/03* (2013.01); *H01L 24/06* (2013.01);
(Continued)

(58) Field of Classification Search
CPC ......... H01L 23/00; H01L 24/13; H01L 24/06; H01L 2224/13147; H01L 222/06135; H01L 222/02333; H01L 2224/02311; H01L 2224/13163; H01L 2224/0239
USPC ......................... 257/737, 738, 778, 773, 774
See application file for complete search history.

(56) References Cited

U.S. PATENT DOCUMENTS 8,441,124 B2    5/2013  Wu et al.
2013/0249082 A1*  9/2013  Chien ................. H01L 23/3192
                                                        257/737
(Continued)

OTHER PUBLICATIONS

Partial European Search Report (R. 64 EPC) dated Dec. 6, 2017 in European Application No. 17173147.4.
(Continued)

*Primary Examiner* — A O Williams
(74) *Attorney, Agent, or Firm* — McGinn I.P. Law Group, PLLC.

(57) ABSTRACT

The semiconductor device includes: a semiconductor substrate; a conductor layer formed over the semiconductor substrate and having an upper surface and a lower surface; a conductive pillar formed on the upper surface of the conductor layer and having an upper surface, a lower surface, and a sidewall; a protection film covering the upper surface of the conductor layer and having an opening which exposes the upper surface and the sidewall of the conductive pillar; and a protection film covering the sidewall of the conductive pillar. Then, in plan view, the opening of the protection film is wider than the upper surface of the conductive pillar and exposes an entire region of an upper surface of the conductive pillar.

14 Claims, 23 Drawing Sheets

(51) Int. Cl.
- *H01L 23/31* (2006.01)
- *H01L 23/525* (2006.01)
- *H01L 21/56* (2006.01)
- *H01L 23/532* (2006.01)
- *H01L 21/311* (2006.01)
- *H01L 21/321* (2006.01)

(52) U.S. Cl.
CPC ............ *H01L 24/11* (2013.01); *H01L 24/05* (2013.01); *H01L 24/16* (2013.01); *H01L 24/81* (2013.01); *H01L 2224/0239* (2013.01); *H01L 2224/02311* (2013.01); *H01L 2224/02331* (2013.01); *H01L 2224/02333* (2013.01); *H01L 2224/02377* (2013.01); *H01L 2224/0347* (2013.01); *H01L 2224/03462* (2013.01); *H01L 2224/03914* (2013.01); *H01L 2224/0401* (2013.01); *H01L 2224/05082* (2013.01); *H01L 2224/05083* (2013.01); *H01L 2224/05124* (2013.01); *H01L 2224/05147* (2013.01); *H01L 2224/05166* (2013.01); *H01L 2224/05186* (2013.01); *H01L 2224/05548* (2013.01); *H01L 2224/05567* (2013.01); *H01L 2224/06135* (2013.01); *H01L 2224/10145* (2013.01); *H01L 2224/1147* (2013.01); *H01L 2224/1182* (2013.01); *H01L 2224/1191* (2013.01); *H01L 2224/11334* (2013.01); *H01L 2224/11462* (2013.01); *H01L 2224/11849* (2013.01); *H01L 2224/13021* (2013.01); *H01L 2224/13024* (2013.01); *H01L 2224/1357* (2013.01); *H01L 2224/1369* (2013.01); *H01L 2224/13083* (2013.01); *H01L 2224/13111* (2013.01); *H01L 2224/13139* (2013.01); *H01L 2224/13144* (2013.01); *H01L 2224/13147* (2013.01); *H01L 2224/13163* (2013.01); *H01L 2224/13164* (2013.01); *H01L 2224/13565* (2013.01); *H01L 2224/13686* (2013.01); *H01L 2224/16112* (2013.01); *H01L 2224/16237* (2013.01); *H01L 2224/73104* (2013.01); *H01L 2224/73204* (2013.01); *H01L 2224/81191* (2013.01); *H01L 2224/81411* (2013.01); *H01L 2224/81815* (2013.01); *H01L 2924/3512* (2013.01)

(56) References Cited

U.S. PATENT DOCUMENTS

| | | | |
|---|---|---|---|
| 2013/0341786 A1* | 12/2013 | Hsu | H01L 21/4857 257/737 |
| 2014/0015124 A1 | 1/2014 | Fay et al. | |
| 2014/0124928 A1* | 5/2014 | Lin | H01L 24/13 257/738 |
| 2015/0333025 A1* | 11/2015 | Arvin | H01L 24/13 257/737 |
| 2015/0371915 A1* | 12/2015 | Hashimoto | H01L 23/562 257/531 |
| 2016/0322321 A1* | 11/2016 | Yajima | H01L 24/13 |
| 2017/0098600 A1* | 4/2017 | Sakai | H01L 23/5226 |
| 2017/0110421 A1* | 4/2017 | Liu | H01L 24/02 |
| 2017/0194226 A1* | 7/2017 | Chen | H01L 21/563 |
| 2017/0338185 A1* | 11/2017 | Lin | H01L 23/544 |
| 2017/0345762 A1* | 11/2017 | Chiu | H01L 23/5386 |

OTHER PUBLICATIONS

Extended European Search Report, dated Mar. 13, 2018, in EPO Application No. 17 173 147.4.

* cited by examiner

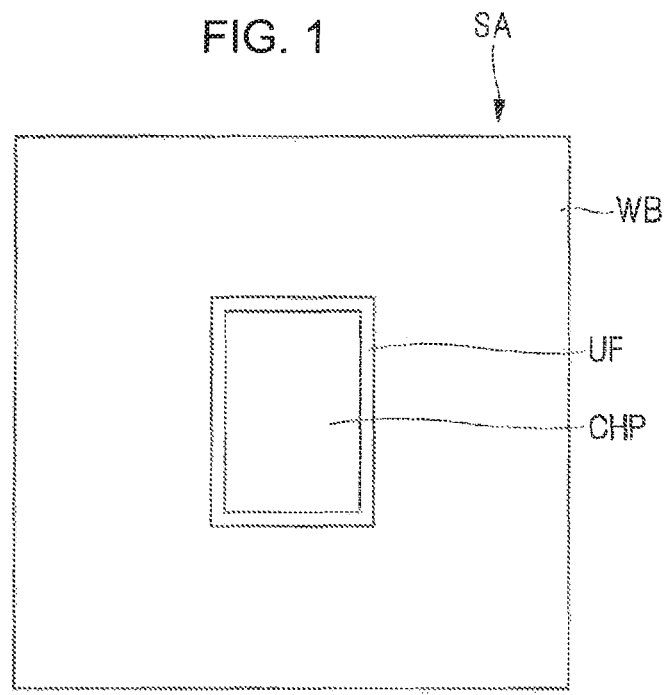
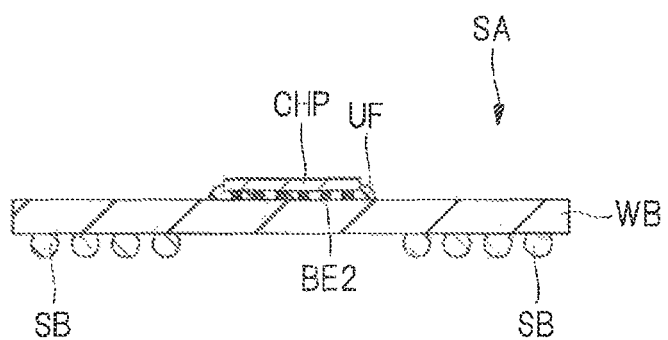

SEMICONDUCTOR DEVICE INCLUDING CONDUCTIVE LAYER AND CONDUCTIVE PILLAR DISPOSED ON CONDUCTIVE LAYER AND METHOD OF MANUFACTURING THE SAME

CROSS-REFERENCE TO RELATED APPLICATION

The present application claims priority from Japanese Patent Application No. 2016-127210 filed on Jun. 28, 2016, the content of which is hereby incorporated by reference into this application.

TECHNICAL FIELD OF THE INVENTION

The present invention relates to a semiconductor device and a method of manufacturing the same and, for example, to a technique effectively applied to a semiconductor device including a semiconductor chip having rewiring (rearranged wiring) and a method of manufacturing the same.

BACKGROUND OF THE INVENTION

U.S. Pat. No. 8,441,124 (Patent Document 1) discloses forming a protection film on the sidewall of the Cu pillar and making a width of a UBM layer larger than a width of the Cu pillar in order to prevent oxidation of the Cu pillar formed over the UBM layer and to prevent an undercut of the UBM layer.

SUMMARY OF THE INVENTION

A bump electrode of the semiconductor chip studied by the inventors of the present application is formed as follows.

After a seed film is formed over a pad electrode formed by a wiring layer over the semiconductor substrate, a resist film opening a region which forms the bump electrode is formed over the seed film, a cylindrical post electrode made of a Cu plating film (conductive pillar, Cu pillar) is formed by plating, the resist film is removed, and then, the seed film extending outside the post electrode is removed by etching. Next, a spherical solder ball is supplied onto the post electrode, and reflow for bump electrode formation is performed, whereby the solder ball is melted, a solder ball electrode is formed over an upper surface of the post electrode, and the bump electrode of the semiconductor chip is completed.

Furthermore, after a pre-solder (wettable solder) is provided on a terminal of the wiring substrate, the semiconductor chip is mounted over the wiring substrate. The reflow for mounting (heat treatment) is performed with the bump electrode placed over the terminal of the wiring substrate via the pre-solder, whereby the bump electrode is bonded to the terminal, and a semiconductor device including the semiconductor chip which has the bump electrode is completed.

The inventors of the present application have recognized the following problems in studying the above-described semiconductor device.

A semiconductor chip made of silicon and the like is mounted over a wiring substrate formed of a glass epoxy resin. Due to installation environment of the semiconductor device or heat generation during an operation of the semiconductor chip, stress is applied to the bump electrode connecting the two, and a crack occurs in a surface protection film, an interlayer insulating film, or the like of the semiconductor chip described below. In particular, when a Low-k material having a low dielectric constant is used as the interlayer insulating film, a crack occurs with high possibility owing to its fragility.

According to the study by the present inventors, when the reflow for mounting is performed, it became clear that a solder ball or a pre-solder or a solder constituting both of the solder ball and the pre-solder (in particular, tin (Sn)) flows out to a sidewall of the post electrode and reaches the pad electrode of the semiconductor chip. Since tin (Sn) has higher hardness than copper (Cu) and the solder flowing out to the sidewall of the post electrode is partially present on the sidewall, it was found that a phenomenon occurs in which stress concentrates locally on the pad electrode, a crack occurs in the surface protection film, the interlayer insulating film, or the like of the semiconductor chip, and problems such as deterioration in moisture resistance or a wiring disconnection occur.

That is, in a semiconductor device having a bump electrode, improvement in reliability or improvement in performance is required.

Other objects and novel characteristics of the present invention will be apparent from the description of the present specification and the accompanying drawings.

A semiconductor device according to one embodiment includes a semiconductor substrate, a conductor layer formed over the semiconductor substrate and having a first upper surface and a first lower surface, a conductive pillar formed on the first upper surface of the conductor layer and having a second upper surface, a second lower surface, and a sidewall, an insulating film covering the first upper surface of the conductor layer and having an opening which exposes the second upper surface and the sidewall of the conductive pillar, and a protection film covering the sidewall of the conductive pillar. Also, in plan view, the opening of the insulating film is wider than the second upper surface of the conductive pillar and exposes an entire region of the second upper surface.

According to one embodiment, reliability of the semiconductor device can be improved.

BRIEF DESCRIPTIONS OF THE DRAWINGS

FIG. 1 is a top view of a semiconductor device according to an embodiment;

FIG. 2 is a side view of the semiconductor device according to the embodiment;

DESCRIPTIONS OF THE PREFERRED EMBODIMENTS

Figure 3:
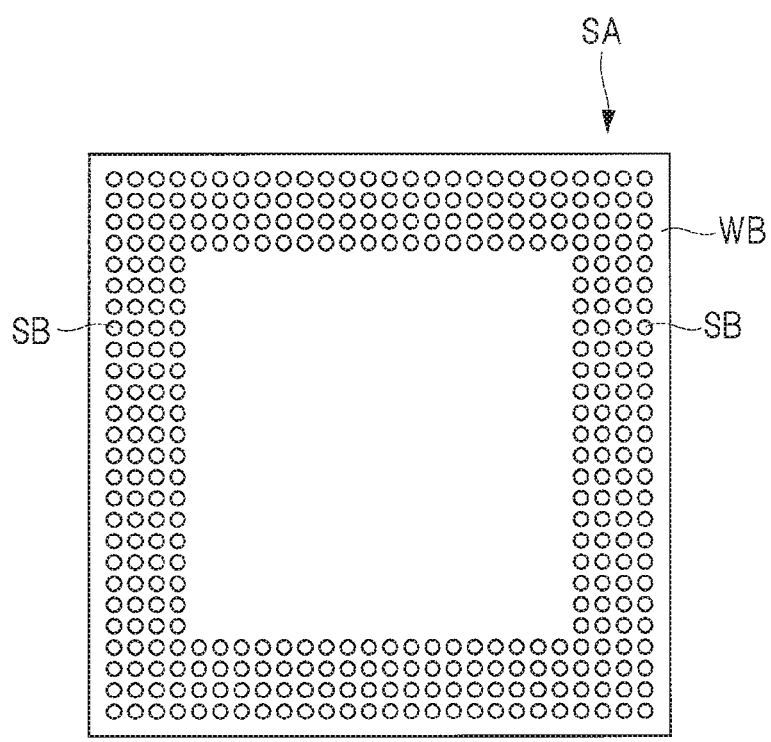
FIG. 3 is a bottom view of the semiconductor device according to the embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specific number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

In addition, components having the same function are, in principle, denoted by the same reference characters throughout the drawings for describing the embodiments, and the repetitive description thereof is omitted. Also, hatching may be used even in a plan view so as to make the drawings easy to see.

(Embodiments)

<Structure of Semiconductor Device>

Figure 4:
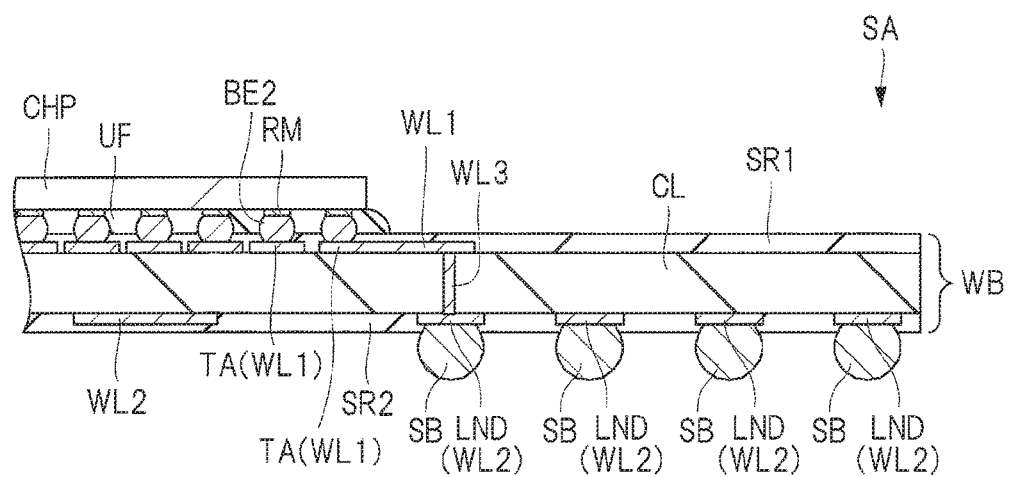
FIG. 4 is a partial cross-sectional view of the semiconductor device according to the embodiment.
Figure 5:
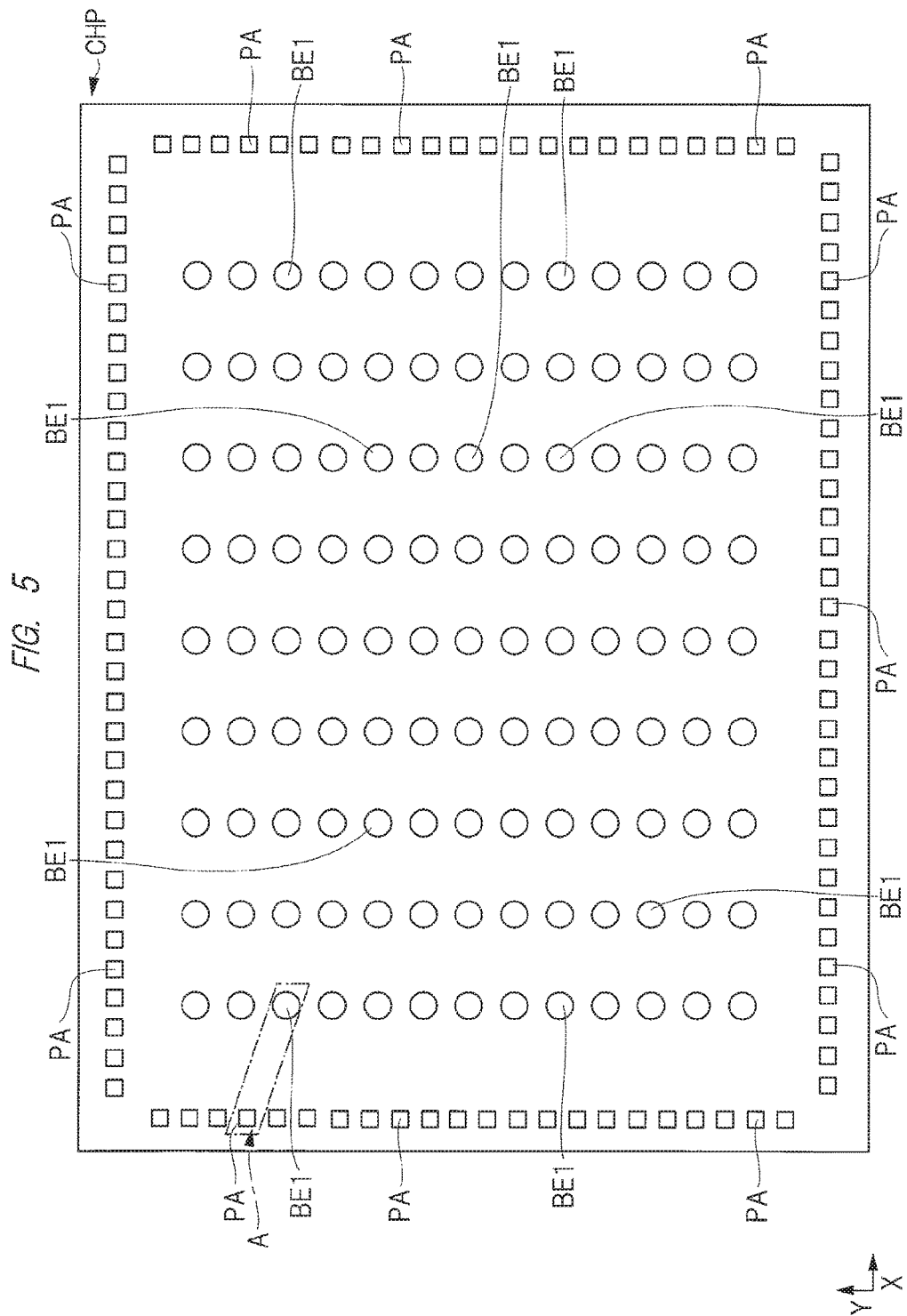
FIG. 5 is a plan view of a semiconductor chip according to the present embodiment.
Figure 6:
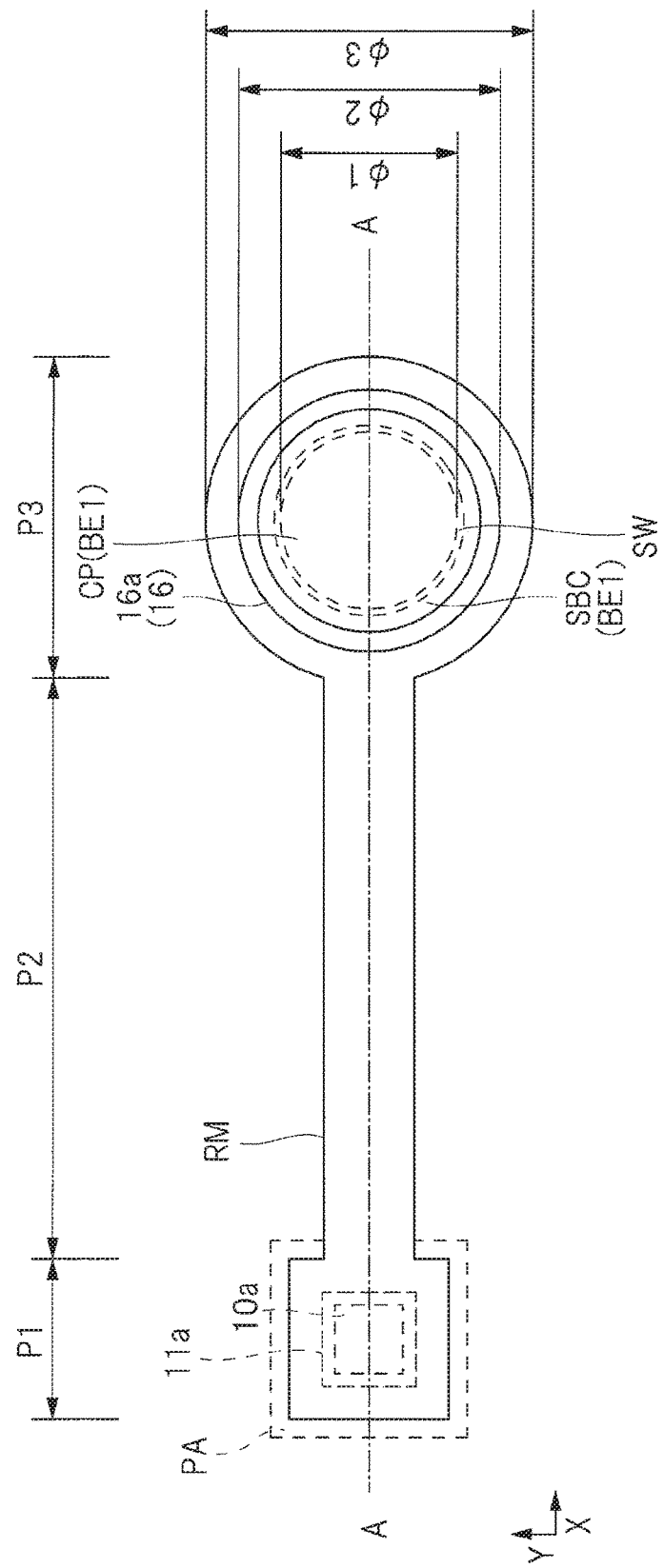
FIG. 6 is an enlarged plan view of a portion A of FIG. 5.
Figure 16:
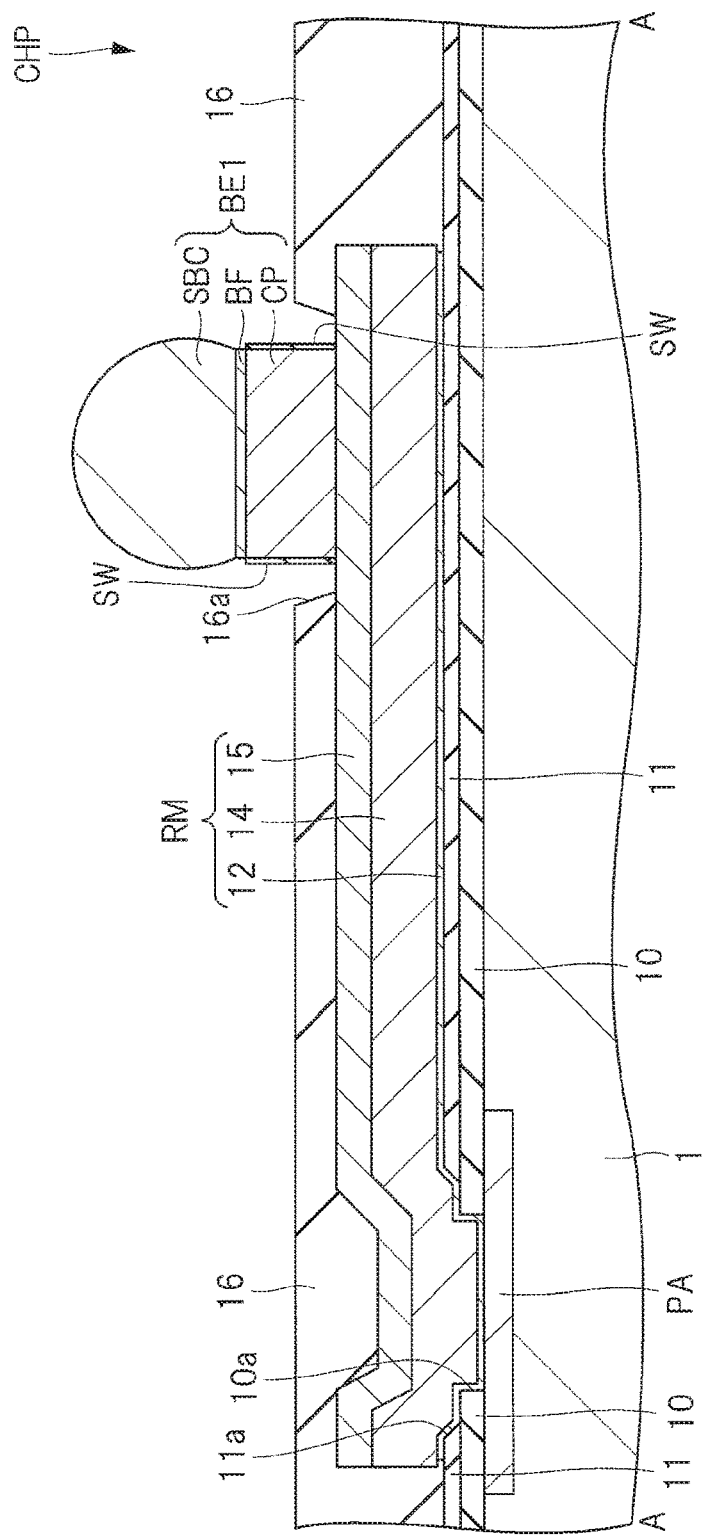
FIG. 16 is a cross-sectional view of a main part during the manufacturing process of the semiconductor device continued from FIG. 15.

FIG. 1 is a top view of a semiconductor device according to an embodiment. FIG. 2 is a side view of the semiconductor device according to the embodiment. FIG. 3 is a bottom view of the semiconductor device according to the embodiment. FIG. 4 is a partial cross-sectional view of the semiconductor device according to the embodiment. FIG. 5 is a plan view of a semiconductor chip according to the present embodiment. FIG. 6 is an enlarged plan view of a portion A of FIG. 5. FIG. 16 is a cross-sectional view taken along an A-A line of FIG. 6.

As illustrated in FIG. 1, the semiconductor device SA according to the present embodiment includes a rectangular (for example, square) wiring substrate WB, and a rectangular semiconductor chip CHP is mounted over the central portion of the wiring substrate WB via a sealing material (underfill) UF. As illustrated in FIG. 1, a size of the semiconductor chip CHP is smaller than a size of the wiring substrate WB.

Next, as illustrated in FIG. 2, the semiconductor device SA according to the present embodiment includes the wiring substrate WB, and a plurality of solder balls for board SB are formed over the back surface (lower surface) of the wiring substrate WB. Meanwhile, a semiconductor chip CHP is mounted over the front surface (main surface, upper surface) of the wiring substrate WB, and a plurality of bump electrodes BE2 are formed in the semiconductor chip CHP. A height of the bump electrode BE2 is, for example, substantially 40 μm to 200 μm. Then, the semiconductor chip CHP and the wiring substrate WB are electrically connected to each other by these bump electrodes BE2. Note that, as illustrated in FIG. 2, a gap between the semiconductor chip CHP and the wiring substrate WB caused by presence of the bump electrodes BE2 is filled with the sealing material UF. The sealing material UF is in contact with a main surface of the semiconductor chip CHP, the front surface of the wiring substrate WB, and a side surface (front surface) of the bump electrode BE2.

Subsequently, as illustrated in FIG. 3, the plurality of solder balls for board SB are arranged in an array over the back surface of the wiring substrate WB. FIG. 3 illustrates an example in which the solder balls for board SB are arranged in four rows, for example, along an outer peripheral portion (outer edge portion) of the wiring substrate WB. These solder balls for board SB function as external connection terminals for connecting the semiconductor device SA to an external apparatus. That is, the solder balls for board SB are used when the semiconductor device SA is mounted over a circuit board typified by, for example, a motherboard. The solder balls for board SB can be also arranged in a matrix over the entire back surface of the wiring substrate WB.

FIG. 4 is a partial cross-sectional view of the semiconductor device SA according to the present embodiment. Although the wiring substrate WB has a multilayer wiring structure, in FIG. 4, only one layer of the core layer CL, and only one layer of wiring WL1 on a front surface side and only one layer of wiring WL2 on a back surface side of the core layer CL are illustrated. The wiring WL1 formed on the front surface side of the core layer CL has an upper surface and a side surface covered with a solder resist film SR1. A terminal TA formed at a part of the wiring WL1 is exposed from the solder resist film SR1 at an opening provided in the solder resist film SR1, and the bump electrode BE2 is connected to the terminal TA at the opening. The wiring WL2 formed on the back surface side of the core layer CL has an upper surface and a side surface covered with the solder resist film SR2. A land LND formed at a part of the wiring WL2 is exposed from the solder resist film SR2 at an opening provided in the solder resist film SR2, and the solder ball for board SB is connected to the land LND at the opening. The wiring WL1 on the front surface side is connected to the wiring WL2 on the back surface side by the wiring WL3 provided inside the via penetrating through the core layer CL. The solder resist films SR1 and SR2 are insulating films made of an insulating resin, and the core layer CL is made of, for example, a resin substrate having a glass epoxy resin or the like as an insulating layer.

The semiconductor chip CHP is mounted over the wiring substrate WB, and the bump electrode BE2 connected to a conductor layer (rewiring, rearranged wiring) RM formed over the main surface of the semiconductor chip CHP is connected to the terminal TA exposed from the solder resist film SR1. Then, the sealing material UF is filled in the gap between the semiconductor chip CHP and the wiring substrate WB. That is, the semiconductor chip CHP is mounted over the front surface of the wiring substrate WB via the bump electrodes BE2 such that the main surface of the semiconductor chip CHP faces the front surface of the wiring substrate WB. Then, a space between the main surface of the semiconductor chip CHP and the front surface of the wiring substrate WB is completely filled with the sealing material UF, and spaces between the plurality of bump electrodes BE2 are also completely filled with the sealing material UF. That is, a sidewall (side surface, front surface) of the bump electrode BE2 is in contact with the sealing material UF in the entire circumference. The sealing material UF is provided, for example, to relieve stress applied to a bonding portion between the bump electrode BE2 and the terminal TA and is made of an insulating resin film such as epoxy resin, for example. The bump electrode BE2 represents a bump electrode in a state where the semiconductor chip CHP is connected to the wiring substrate WB. Meanwhile, as illustrated in FIGS. 5 and 6, the bump electrode formed over the main surface of the semiconductor chip CHP before the semiconductor chip CHP is connected to the wiring substrate WB is referred to as the bump electrode BE1. The bump electrodes BE1 and BE2 are in corresponding positions in plan view.

Over the main surface of the semiconductor chip CHP illustrated in FIG. 5, pad electrodes PA are arranged in a row in a peripheral edge portion of the semiconductor chip CHP. The pad electrodes PA are arranged in one row along each of two long sides and two short sides of the rectangular main surface, and a row of annular pad electrodes PA is configured. Then, inside the row of annular pad electrodes PA, the plurality of bump electrodes BE1 are arranged in a matrix in an X direction and a Y direction, constituting a group of the bump electrodes BE1 as a whole. The plurality of bump electrodes BE1 each of which has a circular shape are arranged at equal pitches in the X direction or the Y direction. Circles in FIG. 5 are all bump electrodes BE1. The pad electrodes PA can be also arranged in two rows or in two rows in a staggered pattern along each side. The semiconductor chip CHP may be formed in a square shape.

The pad electrodes PA and the bump electrodes BE1 are connected to each other by the conductor layer RM (not illustrated), and the conductor layer RM extends from the peripheral edge portion to the central portion of the semiconductor chip CHP. That is, the pad electrode PA arranged in the peripheral edge portion of the semiconductor chip CHP is rearranged to the bump electrode BE1 arranged in a matrix in the central portion of the semiconductor chip CHP by using the conductor layer RM. A pitch of the adjacent bump electrodes BE1 is larger than a pitch of the adjacent pad electrodes PA. In this case, the pitch of the adjacent bump electrodes BE1 and the pitch of the adjacent pad electrodes PA are intended to be the respective minimum ones. Making the pitch of the adjacent bump electrodes BE1 which function as the external connection terminals of the semiconductor chip CHP larger than the pitch of the adjacent pad electrodes PA facilitates connection with the above-described wiring substrate WB.

FIG. 6 illustrates the pad electrode PA and the bump electrode BE1 in the portion A in FIG. 5. As illustrated in FIG. 6, the pad electrode PA is connected to the bump electrode BE1 via the conductor layer RM. The bump electrode BE1 includes a conductive pillar CP and a solder ball electrode SBC.

The conductor layer RM is constituted by a first region P1 which is a connection portion with the pad electrode, a third region P3 which is a connection portion with the bump electrode, and a second region P2 which connects the first region P1 and the third region P3.

In the first region P1 which is one end of the conductor layer RM, the conductor layer RM is connected to the pad electrode PA through square openings 10a and 11a. As will be described below, in cross-sectional view, a surface protection film 10 and a protection film 11 are interposed between the pad electrode PA and the conductor layer RM, the opening 10a is formed in the surface protection film 10, and the opening 11a is formed in the protection film 11. In the first region P1, the one end of the conductor layer RM is a square, and one side thereof is larger than one side of each of the openings 10a and 11a. In addition, the one end of the conductor layer RM and the openings 10a and 11a may be formed in a circular shape, but it is important that a diameter of the one end of the conductor layer RM is larger than diameters of the openings 10a and 11a.

In the third region P3 which is the other end of the conductor layer RM, the bump electrode BE1 is connected to the conductor layer RM in an opening 16a of a protection film 16. As will be described later, in cross-sectional view, the conductor layer RM is covered with the protection film 16, but a part thereof is exposed from the protection film 16 through the opening 16a. Then, in the opening 16a, the conductive pillar CP is arranged on the conductor layer RM.

As illustrated in FIG. 6, in the third region P3, the conductor layer RM has a circular shape with a diameter ($\varphi 3$), the opening 16a of the protection film 16 has a circular shape with a diameter ($\varphi 2$), and the conductive pillar CP has a circular shape with a diameter ($\varphi 1$). Then, it is important to have a relation of diameter ($\varphi 3$)>diameter ($\varphi 2$)>diameter ($\varphi 1$). A protection film SW having a film thickness (t) is formed all over a circumference of a sidewall of the conductive pillar CP, and as will be described below, the protection film SW is formed over the sidewall of the conductive pillar CP over the entire region also in a height direction of the conductive pillar CP. In order to form the protection film SW over the sidewall of the conductive pillar CP, it is important to satisfy a relation of diameter (φ2) >diameter (φ1), and further, it is important to have a relation of diameter (φ2)>diameter (φ1)+t. That is, as illustrated in FIG. 6, in plan view, the entire region of the conductive pillar CP and the protection film SW is positioned inside the opening 16a and is completely exposed from the protection film 16.

In addition, in the third region P3, an outer circumference of the conductor layer RM is desirably covered with the protection film 16 all over the circumference, and it is important to have a relation of diameter (φ3)>diameter (φ2). Then, in order to maintain the relation of diameter (φ3) >diameter (φ2), it is desirable to make the diameter (φ3) of the conductor layer RM larger than the diameter (φ1) of the conductive pillar CP by 10 μm or more by taking a processing margin of the protection film 16 and the like into consideration.

From the above, it is possible to set each diameter as φ1=70 μm, φ2=76 μm, and φ3=80 μm, for example.

In addition, a diameter of the spherical solder ball electrode SBC arranged over the conductive pillar CP is set to be larger than the diameter (φ1) of the conductive pillar CP and smaller than the diameter (φ2) of the opening 16a but may be set to be larger than the diameter (φ2) of the opening 16a or the diameter (φ1) of the conductor layer RM.

In the second region P2 connecting the first region P1 and the third region P3, a width of the conductor layer RM (Y direction in FIG. 6) is narrower than widths of the conductor layer RM in the first region P1 and the third region P3 (Y direction in FIG. 6). At a boundary between the second region P2 and the third region P3, the width of the conductor layer RM (Y direction in FIG. 6) may be increased gradually or stepwise from the second region P2 to the third region P3.

As described above, the conductor layer RM is covered with the protection film 16, but in FIG. 6, the conductor layer RM is indicated by a solid line.

Next, a sectional structure of the semiconductor device of the present embodiment will be described with reference to FIG. 16. FIG. 16 is the cross-sectional view taken along the A-A line of FIG. 6.

As illustrated in FIG. 16, the pad electrode PA is formed over the semiconductor substrate 1, and the surface protection film 10 and the protection film 11 are formed over the semiconductor substrate 1 and the pad electrode PA. The surface protection film 10 and the protection film 11 have the openings 10a and 11a exposing apart of the pad electrode PA. The opening 11a has a diameter larger than that of the opening 10a and opens the entire region of the opening 10a.

The pad electrode PA is constituted by a conductor film made of, for example, an aluminum film, an aluminum alloy film (AlSi film, AlCu film, AlSiCu film, or the like), or a copper film. When the pad electrode PA is formed of an aluminum film or an aluminum alloy film, a metal barrier film may be provided over and under the aluminum film or the aluminum alloy film. For example, the pad electrode PA can have a layered structure of Ti film/TiN film/AlCu film/TiN film from the bottom. In addition, when the pad electrode PA is formed of a copper film, a metal barrier film may be provided under the copper film and a metal barrier film for preventing oxidation may be provided over the copper film. For example, the pad electrode PA can have a layered structure of TaN film/Cu film/Ni film from the bottom.

The surface protection film 10 is made of an inorganic insulating film and constituted by, for example, a silicon oxide film, a silicon nitride film, or a layered film of the two. Incidentally, in the case of a layered film, a silicon oxide film and a silicon nitride film are layered in this order from the bottom. A film thickness of the surface protection film 10 is preferably, for example, 1 μm or less.

The protection film 11 is made of an organic insulating film and constituted by, for example, a polyimide film having a film thickness of substantially 3 to 5 μm. The protection film 11 has a stress relief function of preventing the stress applied to the bump electrode BE1 and the conductor layer RM from propagating to the surface protection film 10, the semiconductor chip CHP, and the like.

As illustrated in FIG. 16, the conductor layer RM is formed over the surface protection film 10 and the protection film 11, and the conductor layer RM is in contact with the pad electrode PA to be connected thereto through the respective openings 10a and 11a of the surface protection film 10 and the protection film 11. That is, a lower surface of the conductor layer RM is in contact with an upper surface of the pad electrode PA in the respective openings 10a and 11a of the surface protection film 10 and the protection film 11. The conductor layer RM is constituted by a layered film of a seed layer 12 and plating films 14 and 15, and the plating films 14 and 15 have the same shape in plan view. The seed layer 12 also has substantially the same shape as the plating films 14 and 15 in plan view, but as will be described below, an end of the seed layer 12 has a shape receded slightly inward (toward the pad electrode PA side) from an end of the plating film 14. That is, the seed layer 12 has an undercut relative to the plating film 14. Although not illustrated, the seed layer 12 has a layered structure of a barrier layer which prevents a reaction between the pad electrode PA and the conductor layer RM, and a plating seed layer obtained in electrolytic plating. The barrier layer is constituted by a layered film of, for example, a titanium (Ti) film, a titanium nitride (TiN) film, and a titanium (Ti) film in this order from the bottom, and film thicknesses thereof are set to 10 nm, 50 nm, and 10 nm in this order. The plating seed layer is formed over the barrier layer, is made of a copper film, and is set to have a film thickness of 100 to 500 nm. The plating film 14 is made of a copper film and is set to have a film thickness of substantially 5 to 20 μm, and the plating film 15 is made of a nickel film and is set to have a film thickness of 2 to 3 μm. In addition, as the barrier layer constituting the seed layer 12, a titanium (Ti) film, a titanium nitride (TiN) film, a titanium tungsten (TiW) film, a chromium (Cr) film, a tantalum (Ta) film, a tungsten (W) film, a tungsten nitride (WN) film, a high melting point metal film, or a noble metal film (Pd, Ru, Pt, Ni, or the like) may be used.

The conductor layer RM is a wiring having a very low resistance, and has a film thickness thicker (larger) than a film thickness of the pad electrode PA. Then, the film thickness of the conductor layer RM is preferably five to ten times or more of the film thickness of the pad electrode PA.

In addition, as illustrated in FIG. 16, an upper surface (main surface) and a sidewall (side surface) of the conductor layer RM are covered with the protection film 16. In the protection film 16, an opening 16a is formed to expose a part of the upper surface of the conductor layer RM. The protection film 16 covers the upper surface and the sidewall of the conductor layer RM, and it is important that a shoulder portion of the conductor layer RM is not exposed. The protection film 16 is constituted by an organic insulating film, for example, a polyimide film, and is set to have a film thickness of 5 to 8 μm. The diameter (φ2) of the opening 16a is a length of the upper surface of the conductor layer RM exposed from the protection film 16.

In the opening 16a provided in the protection film 16, the conductive pillar CP is connected to the conductor layer RM, and the entire region of the lower surface of the conductive pillar CP is in contact with the upper surface of the conductor layer RM (nickel plating film 15). That is, the opening 16a completely exposes the upper surface and the sidewall (side surface) of the conductive pillar CP. In the opening 16a, the upper surface of the conductor layer RM exposed from the protection film 16 is present all over the circumference of the conductive pillar CP around the conductive pillar CP. The conductive pillar CP is constituted by a copper plating film and has a film thickness of substantially 20 μm.

As illustrated in FIGS. 16 and 6, the protection film SW is formed over the sidewall of the conductive pillar CP, and the protection film SW completely covers the sidewall of the conductive pillar CP. That is, the protection film SW covers the entire region of the sidewall in the height direction and the circumferential direction of the circular conductive pillar CP in plan view. The protection film SW is an organic film containing copper (Cu) and has a film thickness of substantially 100 nm. In addition, the protection film SW contains copper (Cu), carbon (C), nitrogen (N), hydrogen (H), and oxygen (O). The protection film SW is a mixed layer of imide and $Cu_2O$. For example, the protection film SW has a function of preventing solder (for example, Sn) contained in the solder ball electrode SBC or the pre-solder 19 described below from adhering to the sidewall of the conductive pillar CP.

As illustrated in FIG. 16, the solder ball electrode SBC is formed over the upper surface of the conductive pillar CP via the barrier layer BF. The solder ball electrode SBC is, for example, a lead-free solder material made of ternary tin (Sn), silver (Ag), and copper (Cu). Specifically, a solder material having a composition ratio of Sn, 1.0% Ag, and 0.5% Cu can be used. In addition, for the solder material, the composition ratio may be changed, or bismuth (Bi) or other additives may be contained appropriately.

In addition, the barrier layer BF is made of a noble metal such as gold (Au), silver (Ag), palladium (Pd), or the like. That is, the upper surface of the conductive pillar CP is covered with a barrier layer BF made of the noble metal. Covering the upper surface of the conductive pillar CP with the barrier layer BF made of the noble metal makes it possible to prevent formation of the protection film SW over the upper surface of the conductive pillar CP in forming the protection film SW over the sidewall of the conductive pillar CP. As the barrier layer BF, for example, a noble metal alloy such as a Pd alloy, an Au alloy, or an Ag alloy can be used instead of the noble metal. In addition, in order to prevent the solder ball electrode SBC or the solder (for example, Sn) contained in the pre-solder 19 described below from diffusing into the conductive pillar CP, it is preferable that the barrier layer BF has a layered structure of a diffusion preventing film and a noble metal film or a noble metal alloy film. The diffusion preventing film is preferably interposed between the noble metal film or the noble metal alloy film and the conductive pillar CP. As the diffusion preventing film, nickel (Ni) or a nickel alloy can be used.

In addition, as illustrated in FIG. 16, the bump electrode BE1 is constituted by the conductive pillar CP, the barrier layer BF, and the solder ball electrode SBC.

<Method of Manufacturing Semiconductor Device>

Figure 7:
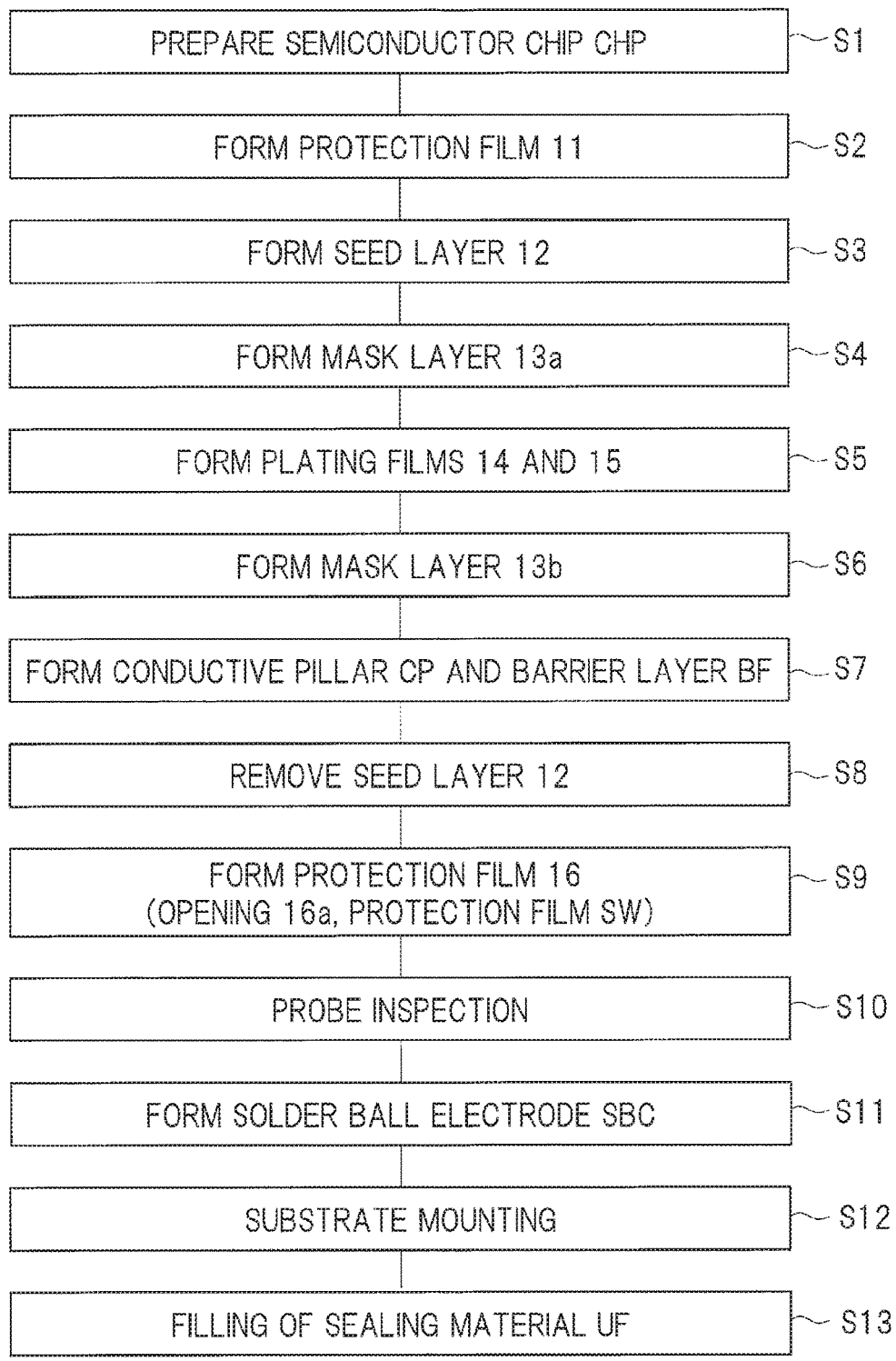
FIG. 7 is a process flow chart illustrating a part of a manufacturing process of the semiconductor device of the present embodiment.

Next, a method of manufacturing the semiconductor device according to the present embodiment will be described with reference to FIGS. 7 to 19. FIG. 7 is a process flow chart illustrating details of one process of a manufacturing process of the semiconductor device of the present embodiment. FIG. 14 is a process flow chart illustrating details of one process during the manufacturing process of the semiconductor device of the present embodiment. FIGS. 8 to 13 and FIGS. 15 to 19 are cross-sectional views of a main part during the manufacturing process of the semiconductor device of the present embodiment.

Figure 8:
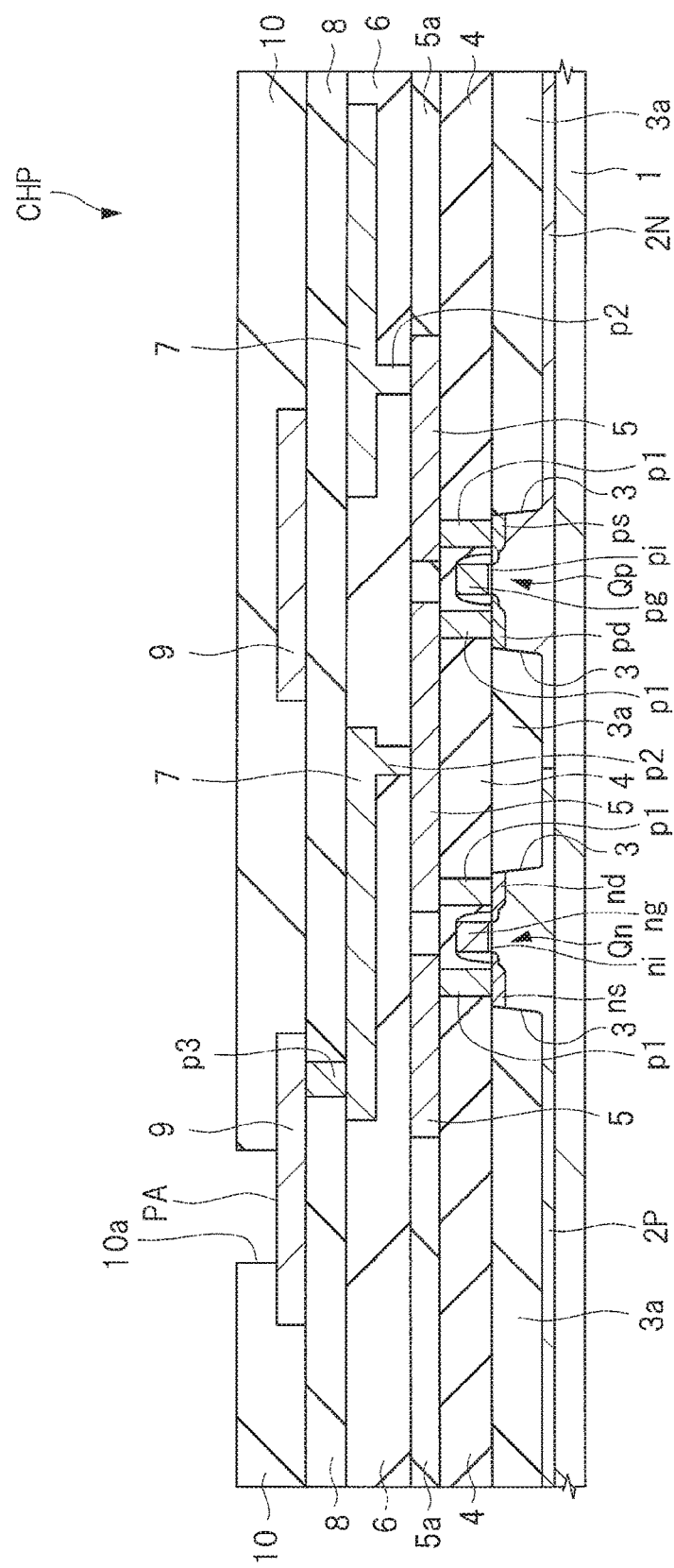
FIG. 8 is a cross-sectional view of a main part during the manufacturing process of the semiconductor device of the present embodiment.

As illustrated in FIG. 8, a semiconductor chip CHP having a pad electrode PA formed over a front surface thereof is provided (prepared) (step S1 in FIG. 7).

As illustrated in FIG. 8, for example, a p-type well 2P, an n-type well 2N, and an element isolation trench 3 are formed in the semiconductor substrate 1 made of p-type single crystal silicon, and an element isolation film 3a made of, for example, a silicon oxide film is embedded in the element isolation trench 3.

An n-channel MIS transistor (Qn) is formed in the p-type well 2P. The n-channel MIS transistor (Qn) is formed in an active region defined by the element isolation trench 3, and includes a source region ns and a drain region nd formed in the p-type well 2P, and a gate electrode ng formed over the p-type well 2P via a gate insulating film ni. In addition, a p-channel MIS transistor (Qp) is formed in the n-type well 2N, and the p-channel MIS transistor (Qp) includes a source region ps and a drain region pd, and a gate electrode pg formed over the n-type well 2N through a gate insulating film pi.

Above the n-channel MIS transistor (Qn) and the p-channel MIS transistor (Qp), a wiring made of a metal film connecting between semiconductor elements is formed. The wiring connecting between the semiconductor elements generally has a multilayer wiring structure of substantially three to ten layers, and in FIG. 8, as an example of the multilayer wiring, two layers of wiring layers (a first-layer Cu wiring 5, a second-layer Cu wiring 7) constituted by a metal film mainly composed of a copper alloy and a single wiring layer (a third-layer Al wiring 9) constituted by a metal film mainly composed of an Al alloy are illustrated. The "wiring layer" is used when a plurality of wirings formed in each wiring layer are collectively represented. Regarding film thicknesses of the wiring layers, the wiring layer in the second layer is thicker than the wiring layer in the first layer, and the wiring layer in the third layer is thicker than the wiring layer in the second layer.

Interlayer insulating films 4, 6, and 8 made of a silicon oxide film or the like, and plugs p1, p2, and p3 electrically connecting the three layers of the wirings are respectively formed between the n-channel MIS transistor (Qn) and the p-channel MIS transistor (Qp), and the first-layer Cu wiring 5, between the first-layer Cu wiring 5 and the second-layer Cu wiring 7, and between the second-layer Cu wiring 7 and the third-layer Al wiring 9.

The interlayer insulating film 4 is formed over the semiconductor substrate 1 to cover, for example, the semiconductor element, and the first-layer Cu wiring 5 is formed in the insulating film 5a over the interlayer insulating film 4. The first-layer Cu wiring 5 is electrically connected to the source region ns, the drain region nd, and the gate electrode ng of the n-channel MIS transistor (Qn) which is a semiconductor element via, for example, the plug p1 formed in the interlayer insulating film 4. In addition, the first-layer Cu wiring 5 is electrically connected to the source region ps, the drain region pd, and the gate electrode pg of the p-channel MIS transistor (Qp) which is a semiconductor element via the plug p1 formed in the interlayer insulating film 4. Connections between each of the gate electrodes ng and pg and the first-layer Cu wiring 5 are not illustrated. The plugs p1, p2, and p3 are composed of a metal film such as a W (tungsten) film. The first-layer Cu wiring 5 is formed in a wiring trench of the insulating film 5a by the damascene method, and the first-layer Cu wiring 5 has a layered structure of a barrier conductor film and a conductor film mainly composed of copper as an upper layer thereof. The barrier conductor film is composed of tantalum (Ta), titanium (Ti), ruthenium (Ru), tungsten (W), manganese (Mn), and nitride or silicon nitride thereof, or a layered film thereof. The conductor film composed of copper as a main material is formed of copper (Cu) or a copper alloy (an alloy made of copper (Cu) and aluminum (Al), magnesium (Mg), titanium (Ti), manganese (Mn), iron (Fe), zinc (Zn), zirconium (Zr), niobium (Nb), molybdenum (Mo), ruthenium (Ru), palladium (Pd), silver (Ag), gold (Au), indium (In), a lanthanoid-based metal, an actinoid-based metal, or the like).

The second-layer Cu wiring 7 is electrically connected to the first-layer Cu wiring 5 via, for example, the plug p2 formed in the interlayer insulating film 6. The third-layer Al wiring 9 is electrically connected to the second-layer Cu wiring 7 via, for example, the plug p3 formed in the interlayer insulating film 8. The plug p3 is composed of a metal film such as a W (tungsten) film.

The second-layer Cu wiring 7 is formed integrally with the plug p2 in the interlayer insulating film 6, and the second-layer Cu wiring 7 and the plug p2 have a layered structure of a barrier conductor film and a conductor film mainly composed of copper as an upper layer thereof. Then, the barrier conductor film and the conductor film mainly composed of copper are made of the same materials as those of the first-layer Cu wiring 5.

In addition, it is preferable to provide a barrier insulating film which prevents diffusion of copper into the interlayer insulating film 6 or 8 between the first-layer Cu wiring 5 and the interlayer insulating film 6 and between the second-layer Cu wiring 7 and the interlayer insulating film 8, and an SiCN film or a layered film of an SiCN film and an SiCO film can be used for the barrier insulating film.

In addition, the third-layer Al wiring 9 is made of an aluminum alloy film (for example, an Al film to which Si and Cu are added), but it may be used as a Cu wiring.

In addition, the interlayer insulating film 4 is made of a silicon oxide film ($SiO_2$), and it is needless to say that the interlayer insulating film 4 may be composed of a monolayer film or a layered film of a silicon oxide film containing carbon (SiOC film), a silicon oxide film containing nitrogen and carbon (SiCON film), and a silicon oxide film containing fluorine (SiOF film).

Over the third-layer Al wiring 9 which is the wiring layer in the uppermost layer of the multilayer wiring, a surface protection film (protection film, insulating film) 10 made of, for example, a single-layer film such as a silicon oxide film or a silicon nitride film, or two-layer films thereof is formed as a final passivation film. Then, the third-layer Al wiring 9 which is the wiring layer in the uppermost layer exposed on the bottom of the pad opening (opening) 10a formed in the surface protection film 10 constitutes the pad electrode (pad, electrode pad) PA.

Figure 9:
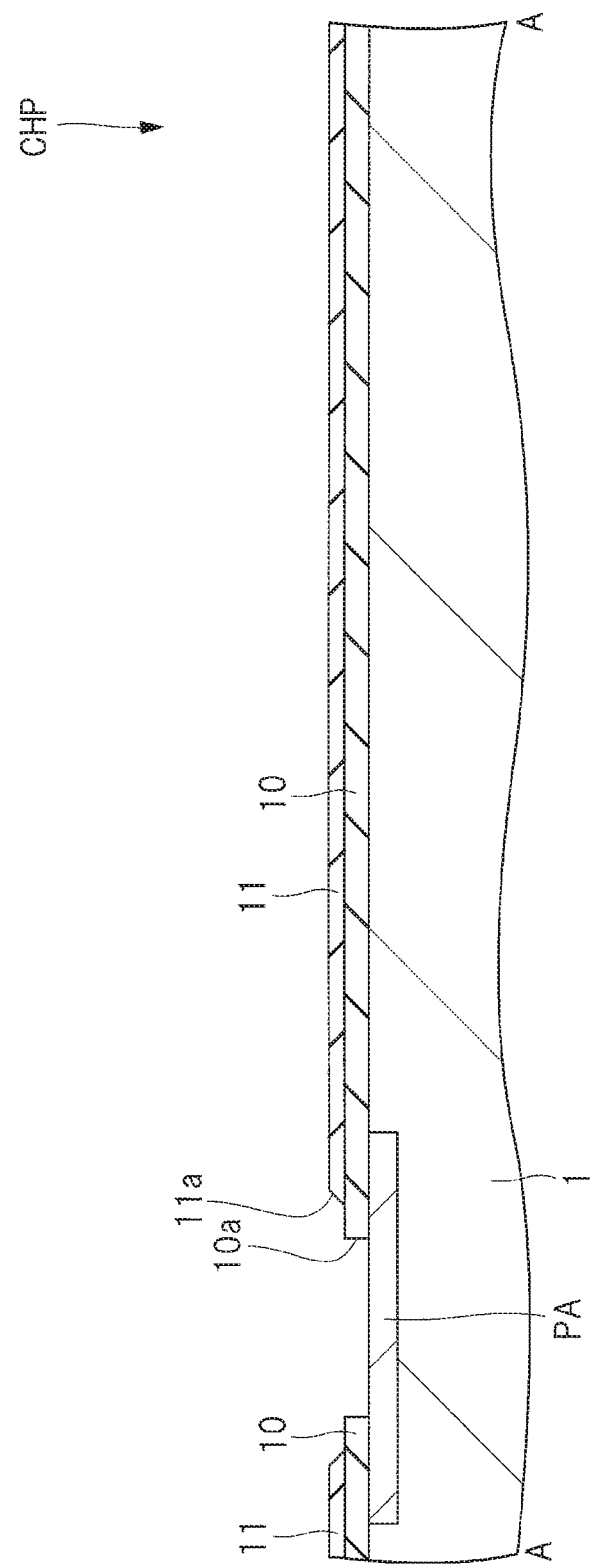
FIG. 9 is a cross-sectional view of a main part during the manufacturing process of the semiconductor device continued from FIG. 8.

Next, as illustrated in FIG. 9, a protection film (organic insulating film) 11 is formed over the surface protection film 10 (step S2 in FIG. 7). Note that, in FIG. 9 and subsequent figures, the wiring layers, the transistors, and the like below the pad electrode PA are omitted. As the protection film 11, a photosensitive polyimide resin is used. The photosensitive polyimide over the surface protection film 10 is applied, exposed, and developed, the opening 10a and the pad electrode PA are exposed, and then, curing (heat treatment) is performed to harden the photosensitive polyimide. That is, by patterning the photosensitive polyimide resin film, the protection film 11 having the opening 11a larger than the opening 10a and the pad electrode PA is formed. In plan view, the openings 10a and 11a are square. Note that the openings 10a and 11a may be circular.

Figure 10:
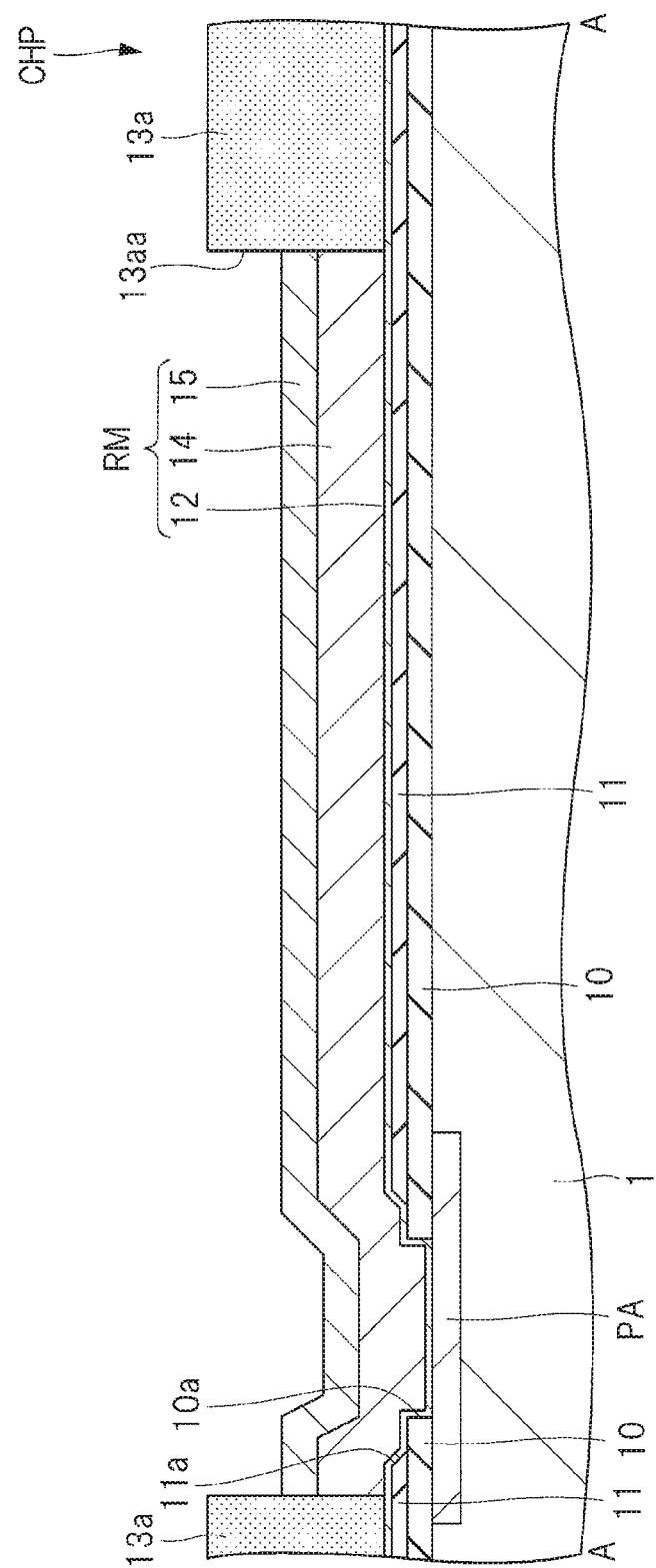
FIG. 10 is a cross-sectional view of a main part during the manufacturing process of the semiconductor device continued from FIG. 9.

Next, as illustrated in FIG. 10, the seed layer 12 is formed over the protection film 11 (step S3 in FIG. 7). The seed layer 12 has a layered structure of a barrier layer and a plating seed film over the barrier layer. For the barrier layer, for example, a titanium film (Ti film), a titanium nitride film (TiN film), and a titanium film (Ti film) are formed by sputtering or the CVD (Chemical Vapor Deposition) and are set to have film thicknesses of 10 nm, 50 nm, and 10 nm, respectively, and for the plated seed film, for example, a copper (Cu) film is formed by sputtering and is set to have a film thickness of 200 nm. The seed layer 12 is in contact with the upper surface of the pad electrode PA and is formed over the sidewall of the surface protection film 10 and the sidewall of the protection film 11 constituting the openings 10a and 11a, respectively, and over an upper surface of the surface protection film 10 and an upper surface of the protection film 11.

Next, as illustrated in FIG. 10, a mask layer (insulating film, organic insulating film) 13a is formed over the seed layer 12 (step S4 in FIG. 7). As the mask layer 13a, a liquid resist or a dry film resist can be used, and its film thickness is set to be, for example, 10 to 30 μm. The mask layer 13a has an opening 13aa, and the opening 13aa of the mask layer 13a contains the openings 11a and 10a. A conductor layer RM is formed inside the opening 13aa exposed from the mask layer 13a.

Next, as illustrated in FIG. 10, plating films 14 and 15 are formed (step S5 in FIG. 7). The plating films 14 and 15 are formed in the opening 13aa of the mask layer 13a by electrolytic plating. In the electrolytic plating process, the seed layer 12 functions as a seed layer. The plating film 14 is set to be a copper (Cu) plating film, and the plating film 15 is set to be a nickel (Ni) plating film. The first plating film 14 completely fills the openings 10a and 11a. After the plating film 15 is formed, the mask layer 13a is removed.

Figure 11:
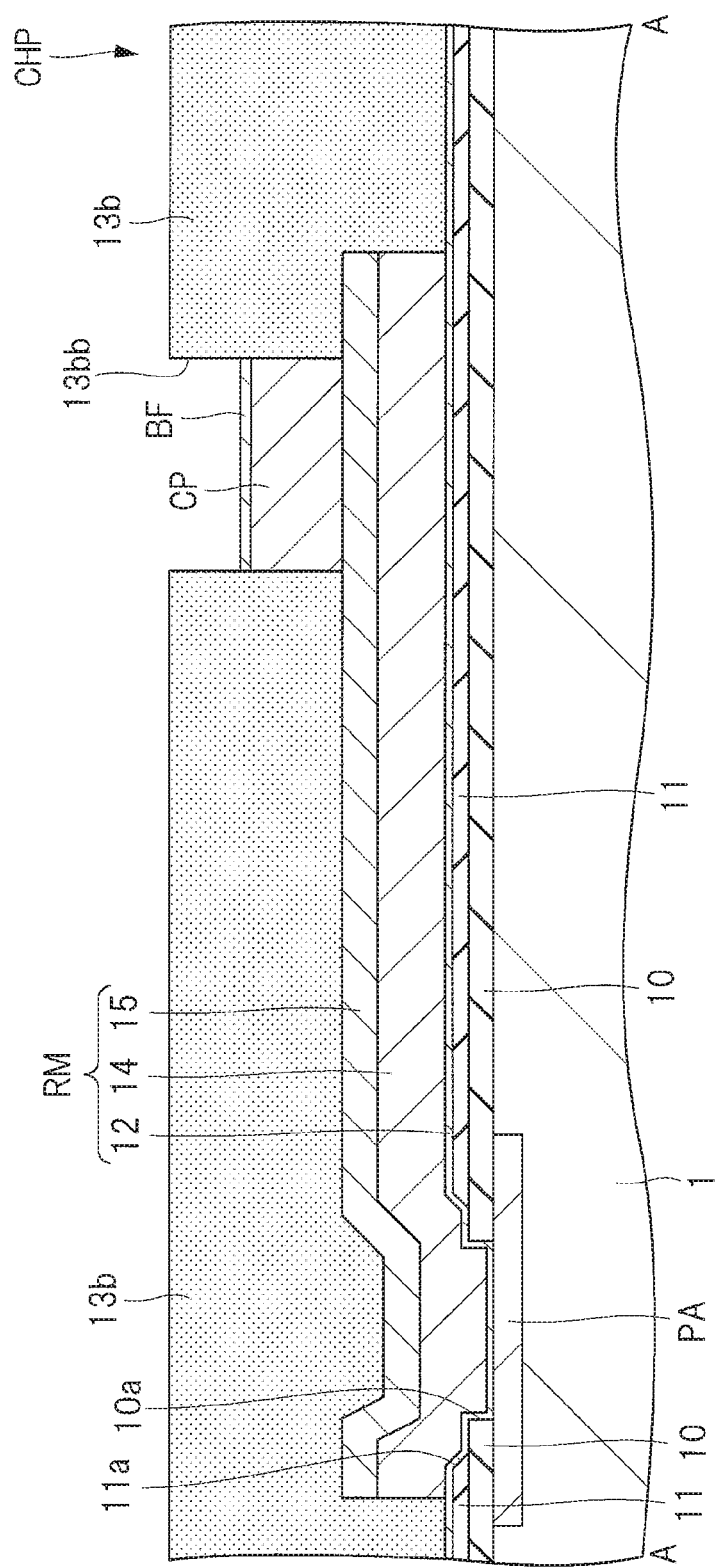
FIG. 11 is a cross-sectional view of a main part during the manufacturing process of the semiconductor device continued from FIG. 10.

Next, as illustrated in FIG. 11, a mask layer (insulating film, organic insulating film) 13b is formed over the conductor layer RM (step S6 in FIG. 7). As the mask layer 13b, a liquid resist or a dry film resist can be used, and its film thickness is set to be, for example, 30 to 40 μm. The mask layer 13b has an opening 13bb, and the opening 13bb of the mask layer 13b does not contain the openings 11a and 10a.

Next, as illustrated in FIG. 11, a conductive pillar CP and a barrier layer BF are formed (step S7 in FIG. 7). By electrolytic plating, a copper (Cu) plating film for the conductive pillar CP, and a nickel (Ni) plating film and a palladium (Pd) plating film for the barrier layer BF are formed in this order on a part of the upper surface of the conductor layer RM exposed from the mask layer 13b and the part being an inside of the opening 13bb. In the electrolytic plating process, the seed layer 12 functions as a seed layer. After the plating film for the barrier layer BF is formed, the mask layer 13b is removed.

Figure 12:
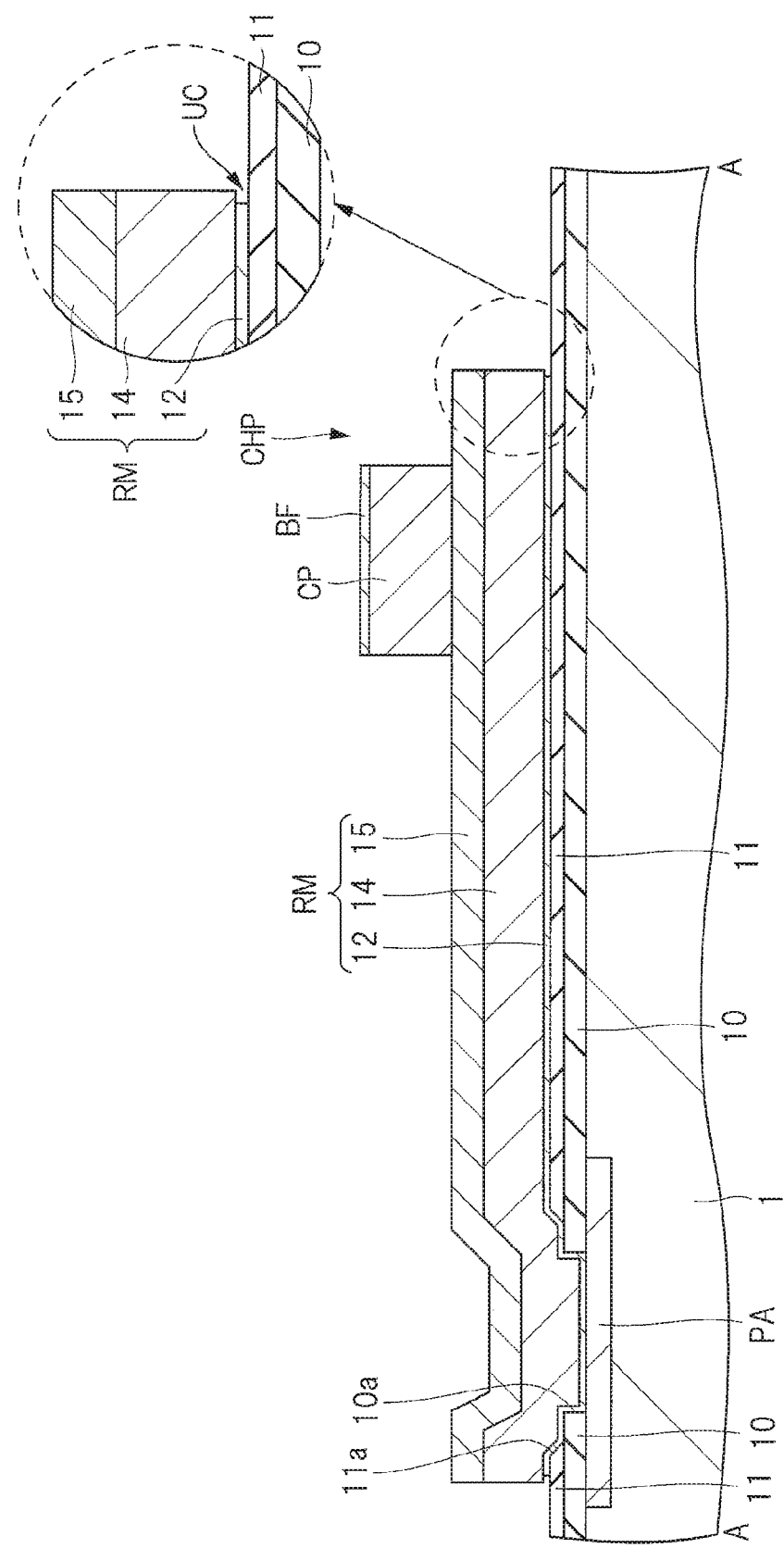
FIG. 12 is a cross-sectional view of a main part during the manufacturing process of the semiconductor device continued from FIG. 11.

Next, as illustrated in FIG. 12, the seed layer 12 is removed (step S8 in FIG. 7). For example, wet etching treatment is applied to the seed layer 12 exposed by removing the above-described mask layer 13b, and the seed layer 12 in a region exposed from the plating films 14 and 15 is removed. Thus, the conductor layer RM constituted by the plating film 15, the plating film 14, and the seed layer 12 is formed. In this process, overetching is needed in order to completely remove the seed layer 12 in the region exposed from the plating films 14 and 15. Therefore, an undercut UC is formed in the seed layer 12. That is, since the end of the seed layer 12 recedes inward (in the direction of the pad electrode PA) from the ends of the plating films 14 and 15, overhangs of the plating films 14 and 15 are formed above the protection film 11. The undercut UC of the seed layer 12 is formed all over the circumference of the conductor layer RM.

Figure 13:
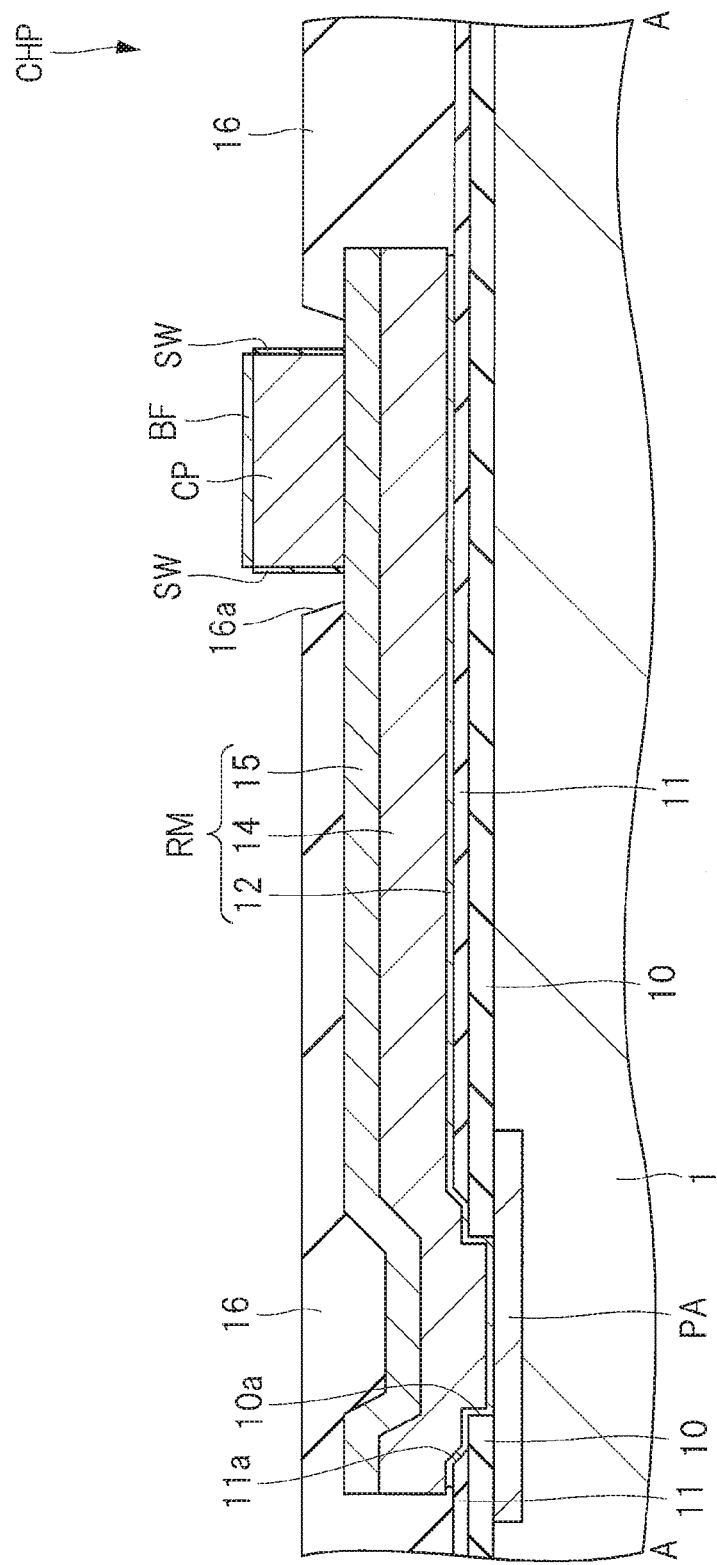
FIG. 13 is a cross-sectional view of a main part during the manufacturing process of the semiconductor device continued from FIG. 12.
Figure 14:
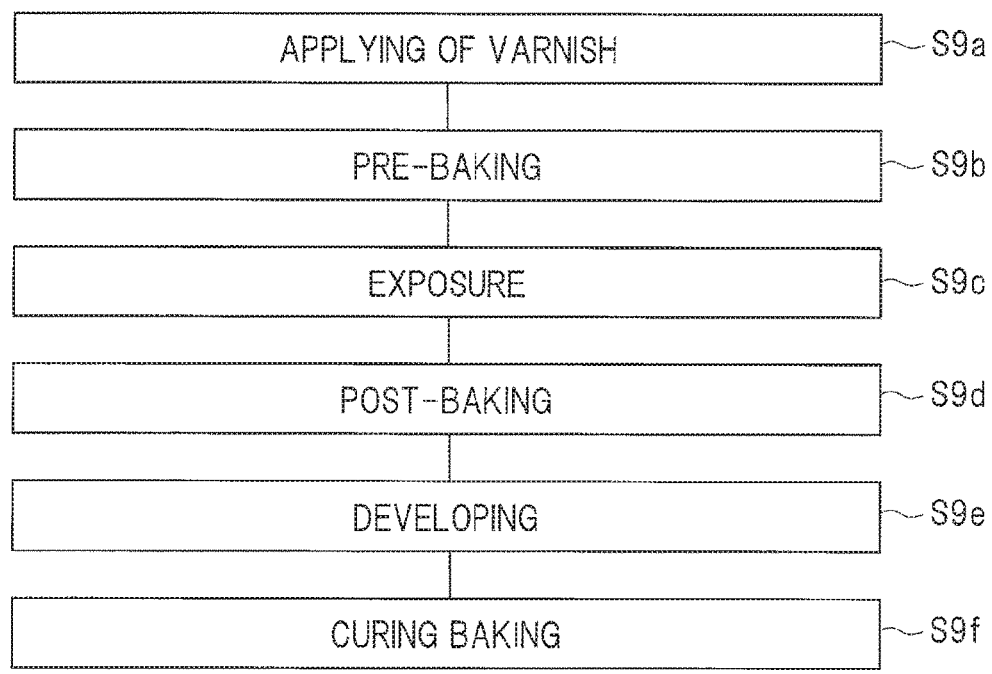
FIG. 14 is a process flow chart illustrating details of one process during the manufacturing process of the semiconductor device of the present embodiment.

Next, as illustrated in FIG. 13, the protection film 16 is formed (step S9 in FIG. 7). Note that the details of this process will be described with reference to the process flow chart in FIG. 14. As illustrated in FIG. 13, the protection film 16 covers the upper surface and the sidewall of the conductor layer RM. The protection film 16 has an opening 16a exposing a part of the upper surface of the conductor layer RM. In addition, in the formation process of the protection film 16, a protection film SW is formed over the sidewall of the conductive pillar CP. Since the upper surface of the conductive pillar CP is covered with the barrier layer BF, the protection film SW is not formed on the upper surface of the conductive pillar CP (the upper surface of the barrier layer BF).

First, a photosensitive polyimide varnish is applied to the semiconductor substrate 1 so as to cover the conductor layer RM and the conductive pillar CP (step S9a in FIG. 14). Then, a photosensitive polyimide varnish layer is formed. The photosensitive polyimide varnish is a polyamic acid solution being a precursor of polyimide.

Next, a pre-baking process is performed on the photosensitive polyimide varnish layer (step S9b in FIG. 14). Pre-baking is a heat treatment at 90 to 100° C. for 270 to 300 seconds.

Next, an exposure process is performed on the photosensitive polyimide varnish layer (step S9c in FIG. 14). For example, the exposure process of irradiating the region corresponding to the opening 16a in FIG. 13 with light is performed.

Next, a post-baking process is performed on the photosensitive polyimide varnish layer (step S9d in FIG. 14). Post-baking is a heat treatment at 100 to 110° C. for 60 to 70 seconds.

Next, a development process is performed on the photosensitive polyimide varnish layer (step S9e in FIG. 14). In the development process, the photosensitive polyimide varnish in the exposed region is removed.

Next, a curing baking process is performed on the photosensitive polyimide varnish layer (step S9f in FIG. 14). Curing baking is a heat treatment at 340 to 350° C. for 180 to 200 seconds.

Thus, the protection film 16 having the opening 16a made of polyimide is formed. Note that, due to the action of the carboxyl group contained in the photosensitive polyimide varnish, in the processes of pre-baking and post-baking, the copper of the conductive pillar CP ionizes to be eluted into the photosensitive polyimide varnish, whereby a complex of copper with the polyamic acid (Cu carboxylate complex) is formed. In the development process, the Cu carboxylate complex remains on the sidewall of the conductive pillar CP. Then, a mixed layer decomposed into imide and $Cu_2O$ and changed in quality is formed due to the dehydrating action in the curing baking process so as to be a protection film SW.

Incidentally, it is confirmed that the protection film SW remains without being removed even if $O_2$ asking is performed after the curing baking, and inhibits a reaction between the solder (Sn) and the copper constituting the conductive pillar CP in the solder reflow process described below.

In addition, since the upper surface of the conductive pillar CP is covered with the barrier layer BF made of a noble metal which is unreactive to the polyamic acid in the formation process of the protection film 16, the protection film SW is not formed on the upper surface of the conductive pillar CP. This is because the barrier layer prevents elution of copper in the pre-baking and the post-baking processes.

Figure 15:
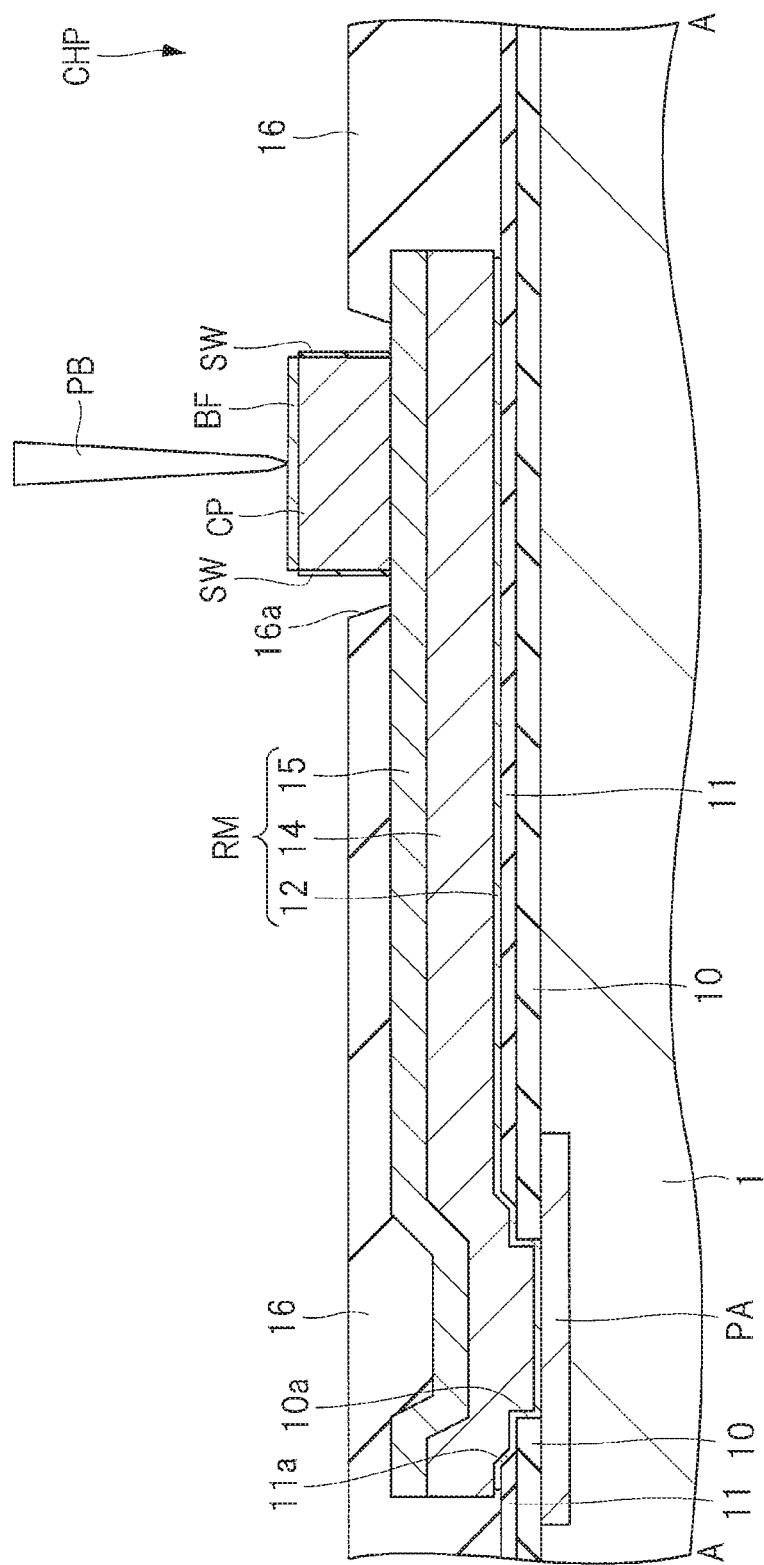
FIG. 15 is a cross-sectional view of a main part during the manufacturing process of the semiconductor device continued from FIG. 13.

Next, as illustrated in FIG. 15, a probe inspection is performed (step S10 in FIG. 7). A probe needle PB is applied to the barrier layer BF formed over the conductive pillar CP, and the electrical characteristics required for the semiconductor device are inspected. In addition, since the probe inspection is performed before the solder ball electrode SBC is formed, it is also possible to perform a memory retention test and the like in which baking is performed for a long time under a high temperature environment of 250 to 300° C., for example.

Next, as illustrated in FIG. 16, a solder ball electrode SBC is formed (step S11 in FIG. 7). After a spherical solder ball is supplied onto the barrier layer BF, a reflow treatment (heat treatment), for example, at 275° C. is performed to melt the solder ball, and the solder ball electrode SBC is formed over the conductive pillar CP via the barrier layer BF. Thus, a bump electrode BE1 constituted by the conductive pillar CP, the barrier layer BF, and the solder ball electrode SBC is formed.

Figure 17:
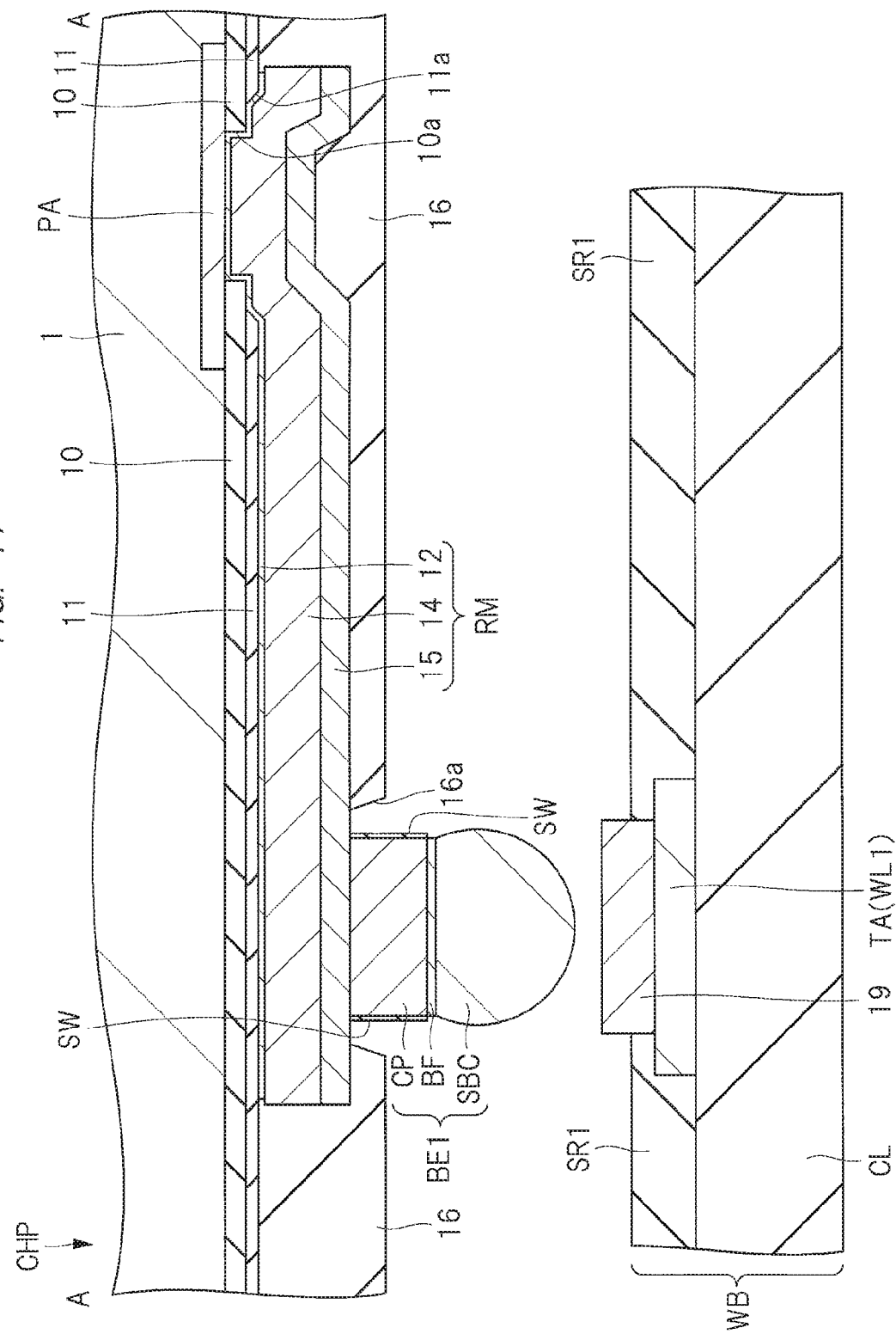
FIG. 17 is a cross-sectional view of a main part during the manufacturing process of the semiconductor device continued from FIG. 16.
Figure 18:
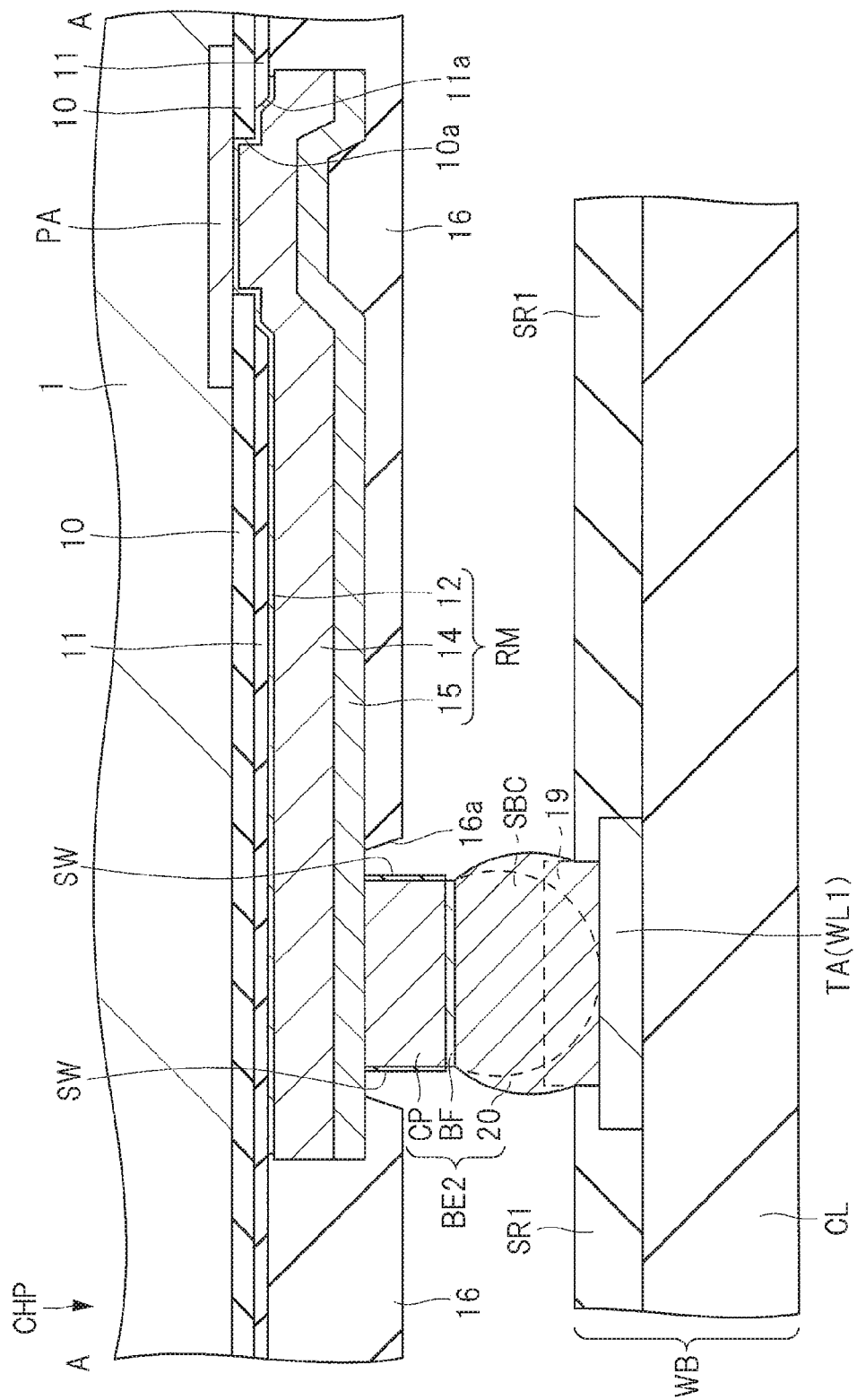
FIG. 18 is a cross-sectional view of a main part during the manufacturing process of the semiconductor device continued from FIG. 17.

Next, as illustrated in FIGS. 17 and 18, substrate mounting is performed (step S12 in FIG. 7). First, as illustrated in FIG. 17, the semiconductor chip CHP is arranged over the wiring substrate WB such that the bump electrode BE1 formed over the main surface of the semiconductor chip CHP faces the terminal TA formed in the front surface of the wiring substrate WB. The pre-solder 19 is formed on the front surface of the terminal TA of the wiring substrate WB. Also in the case of pre-solder 19, a lead-free solder material made of ternary tin (Sn), silver (Ag), and copper (Cu) can be used. Then, the pre-solder 19 on the terminal TA is brought into contact with the bump electrode BE1.

Next, in FIG. 18, for example, reflow at 270 to 280° C. is performed on the semiconductor chip CHP and the wiring substrate WB, and the bump electrode BE1 and the pre-solder 19 are melted to form a solder layer 20. Thus, a bump electrode BE2 constituted by the conductive pillar CP, the barrier layer BF, and the solder layer 20 is formed, and the conductor layer RM and the terminal TA are connected with each other by the bump electrode BE2. That is, the semiconductor chip CHP is connected to the wiring substrate WB by the bump electrode BE2.

Since the sidewall of the conductive pillar CP is covered with the protection film SW, it is possible to prevent the solder layer 20 from extending around the sidewall of the conductive pillar CP. In addition, it is possible to prevent solder wetting (formation of an alloy with copper (Cu) of the conductive pillar CP and solder).

Figure 19:
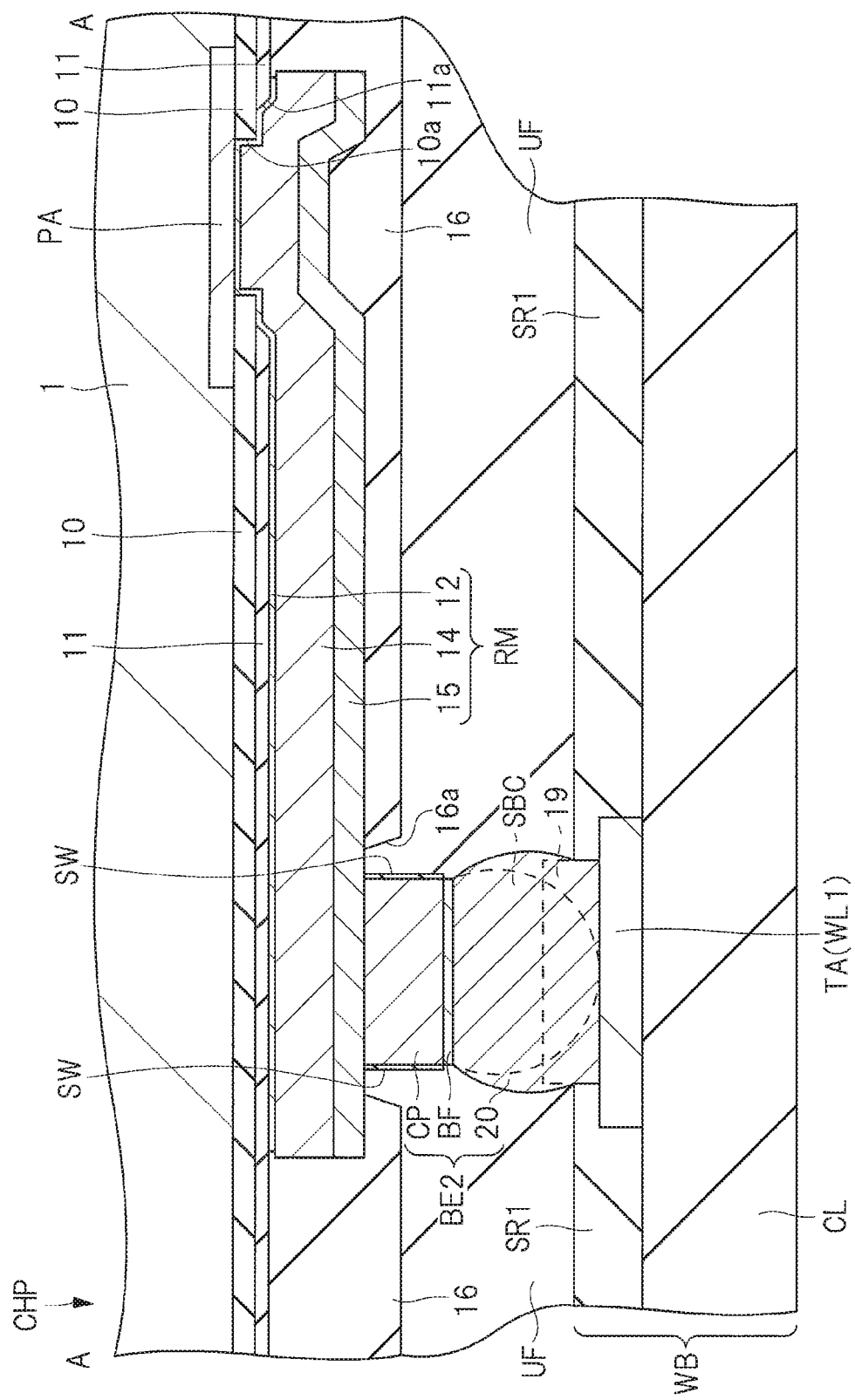
FIG. 19 is a cross-sectional view of a main part during the manufacturing process of the semiconductor device continued from FIG. 18.

Next, as illustrated in FIG. 19, the sealing material UF is filled (step S13 in FIG. 7). The sealing material UF is poured between a plurality of bump electrodes BE2 and between the main surface of the semiconductor chip CHP and the front surface of the wiring substrate WB, and subsequently, heat treatment is applied to remove the solvent, whereby the space between the semiconductor chip CHP and the wiring substrate WB is filled with the sealing material UF. The sealing material UF is in contact with the entire front surface of the protection film 16 of the semiconductor chip CHP, the conductor layer RM exposed from the opening 16a, and the entire front surface of the solder resist film SR1 of the wiring substrate WB. Then, the sealing material UF is in contact with the entire circumference of the bump electrode BE2 and covers the bump electrode BE2 so as to wrap around. However, the entire circumference of the conductive pillar CP is covered with the sealing material UF via the protection film SW. The protection film SW is in contact with the sealing material UF around the conductive pillar CP. That is, the sealing material UF completely covers the side surface of the bump electrode BE2. The sealing material UF fills the space formed by the semiconductor chip CHP, the wiring substrate WB, and the bump electrode BE2 so as not to form any gaps or voids.

Accordingly, since the sidewall of the conductive pillar CP is covered with the protection film SW made of an organic film, adhesion between the conductive pillar CP and the sealing material UF can be improved.

Through the above manufacturing method, the semiconductor device SA of the present embodiment is completed.

<Characteristics of Semiconductor Device and Method of Manufacturing Semiconductor Device of Present Embodiment>

Since the sidewall of the conductive pillar CP is covered with the protection film SW, it is possible to prevent the solder ball electrode SBC or the solder material 20 formed over the upper portion of the conductive pillar CP from extending around the sidewall of the conductive pillar CP. In addition, solder wetting of the sidewall of the conductive pillar CP can be prevented. Therefore, it is possible to prevent a crack and disconnection of a wiring in the surface protection film of the semiconductor chip, the interlayer insulating film, or the like due to the extending of the solder around the sidewall of conductive pillar CP.

Since the conductive pillar CP is formed on the conductor layer RM whose film thickness is thicker than that of the pad electrode PA, and the entire region of the lower surface of the conductive pillar CP is positioned on the conductor layer RM, the stress received by the bump electrode BE2 can be relieved by the conductor layer RM.

In addition, since the entire region of the lower surface of the conductive pillar CP is in contact with the upper surface of the conductor layer RM, a contact resistance between the conductive pillar CP and the conductor layer RM can be reduced.

In addition, the entire region of the lower surface of the conductive pillar CP is in contact with the upper surface of the conductor layer RM, and no seed layer is formed at the interface. The seed layer 12 is formed under the conductor layer RM. Therefore, it is possible to prevent "reduction in width (diameter) of the conductive pillar CP due to the undercut of the seed layer," which is a problem that arises when a seed layer is present at the interface between the conductor layer RM and the conductive pillar CP.

Furthermore, since a protection film 11 made of a polyimide film is interposed between the conductor layer RM and the surface protection film 10, and the entire region of the conductive pillar CP is positioned over the protection film 11 in plan view, the stress received by the bump electrode BE2 is relieved by the protection film 11.

The sidewall of the conductive pillar CP is covered with the protection film SW, and its periphery is covered with the sealing material UF. That is, since the protection film SW made of an organic film is interposed between the conductive pillar CP and the sealing material UF, an adhesive force between the conductive pillar CP and the sealing material UF can be improved, and peeling at the interface between the conductive pillar CP and the sealing material UF can be reduced.

Since the upper surface and the sidewall of the conductor layer RM are covered with the protection film 16 made of an organic film, adhesion to the sealing material UF is improved, and peeling at the interface between the conductor layer RM and the sealing material UF can be reduced.

Since the upper surface of the conductive pillar CP is covered with the barrier layer BF made of the noble metal, the protection film SW made of an organic film containing copper (Cu) is not formed, and the wettability of the solder ball electrode SBC or the solder material 20 is improved.

In addition, since the barrier layer BF includes a layer preventing solder diffusion, bonding strength between the conductive pillar CP and the solder ball electrode SBC or the solder material 20 can be improved.

Since the protection film SW is formed over the sidewall of the conductive pillar CP in the formation process of the protection film 16, the number of manufacturing processes can be reduced, and costs of the semiconductor device can be reduced.

Since the probe inspection is performed after the formation of the conductive pillar CP and before the formation of the solder ball electrode SBC, the high temperature probe inspection at a temperature higher than or equal to the melting temperature of the solder can be achieved. In addition, the probe inspection is performed by applying a probe needle to the upper surface of the conductive pillar CP or the barrier layer BF over the conductive pillar CP. That is, since the probe needle is not applied to the solder ball electrode SBC, it is possible to prevent connection failure between the semiconductor chip CHP and the wiring substrate WB due to height variations of the solder ball electrodes SBC in the plane of the semiconductor chip CHP. When the probe needle is applied to the solder ball electrode SBC, the solder ball electrode SBC is damaged or deformed, and as a result, there arises a problem that height variations occur between the plurality of solder ball electrodes SBC, causing occurrence of connection failure in the substrate mounting process.

In addition, in the formation process of the protection film 16, making the diameter ($\varphi 3$) of the circular conductor layer RM larger than the diameter ($\varphi 1$) of the conductive pillar CP by 10 μm or more in the end of the conductor layer RM (third region P3) allows the processing margin of the opening 16a to be sufficiently secured. That is, in plan view, even if the opening 16a having a diameter ($\varphi 2$) larger than that of the conductive pillar CP is formed in order to completely expose the conductive pillar CP, the end and the sidewall of the conductor layer RM can be covered with the protection film 16. In other words, in plan view, the conductive pillar CP is arranged 5 μm or more inward from the end of the conductor layer RM.

Note that, in the above embodiment, although the conductive pillar CP is formed in a position away from the pad electrode PA, the conductive pillar CP may be formed in a position overlapping with the pad electrode PA. That is, the conductor layer RM may be provided so as to overlap with the pad electrode PA, and the conductive pillar CP may be arranged so as to overlap with the conductor layer RM.

First Modification Example

The first modification example is a modification example of the above embodiment, in which a metal layer is formed in place of the barrier layer, and a heat treatment process is performed after the probe inspection. Processes and configurations common to the above embodiment are denoted by the same reference characters.

Figure 20:
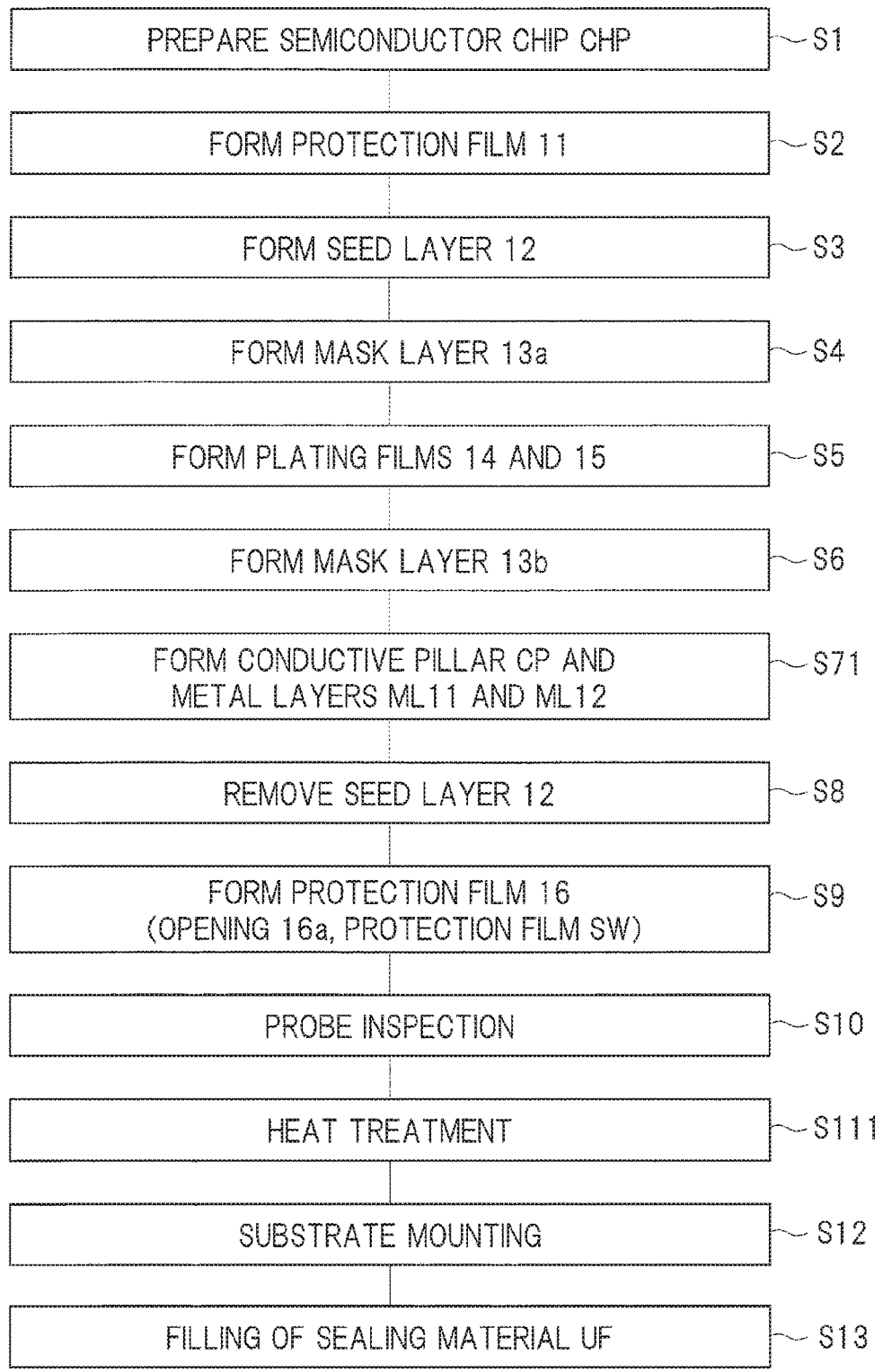
FIG. 20 is a process flow chart illustrating a part of a manufacturing process of a semiconductor device of a first modification example.
Figure 21:
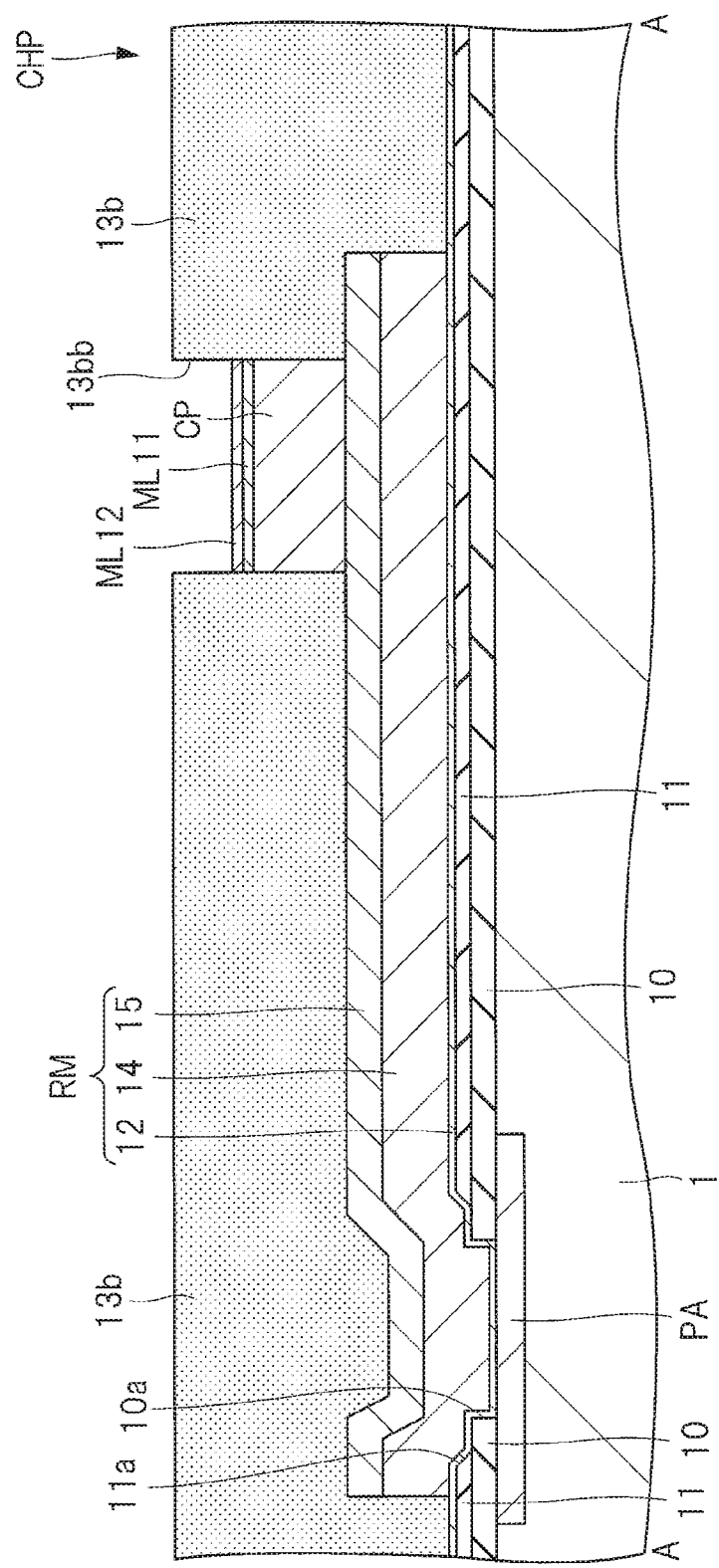
FIG. 21 is a cross-sectional view of a main part during the manufacturing process of the semiconductor device of the first modification example.

FIG. 20 is a process flow chart illustrating a part of a manufacturing process of a semiconductor device of the first modification example. FIG. 21 is a cross-sectional view of a main part during the manufacturing process of the semiconductor device of the first modification example.

After steps S1 to S6 illustrated in FIG. 20 are performed, step S71 in FIG. 20 is performed. As illustrated in FIG. 21, by electrolytic plating, a copper (Cu) plating film for the conductive pillar CP, and a metal layer ML11 made of a tin (Sn) plating film and a metal layer ML12 made of a silver (Ag) plating film are formed in this order on a part of the upper surface of the conductor layer RM exposed from the mask layer 13b, the part being the inside of the opening 13bb.

After steps S8 and S9 in FIG. 20 are performed, in the probe inspection (step S10), a probe needle is applied to the metal layers ML11 and ML12 formed over the conductive pillar CP, and the probe inspection is performed.

Next, a heat treatment process is performed (step S111 in FIG. 20). The heat treatment is performed at a temperature of, for example, 200° C. or less, and a first alloy layer made of $Cu_3Sn$ and a second alloy layer made of $Ag_3Sn$ are formed over the conductive pillar CP by this heat treatment.

Next, steps S12 and S13 in FIG. 20 are performed to complete the semiconductor device of the first modification example.

A heat treatment process (step S111) is performed to form the alloy layers over the upper surface of the conductive pillar CP before the substrate mounting (step S12), and accordingly, oxidation resistance and heat resistance of the front surface are improved, whereby a structure excellent in wettability to the pre-solder on a side of the wiring substrate WB and in high heat resistance of a connection portion as a good solder barrier layer after solder connection can be obtained, and a stable structure can be obtained even in the 200° C. long-term storage tolerance test required for in-car products.

Second Modification Example

The second modification example is a modification example of the above embodiment, in which a metal layer is formed in place of the barrier layer, and a heat treatment process is performed after the probe inspection. Processes and configurations common to the above embodiment are denoted by the same reference characters.

Figure 22:
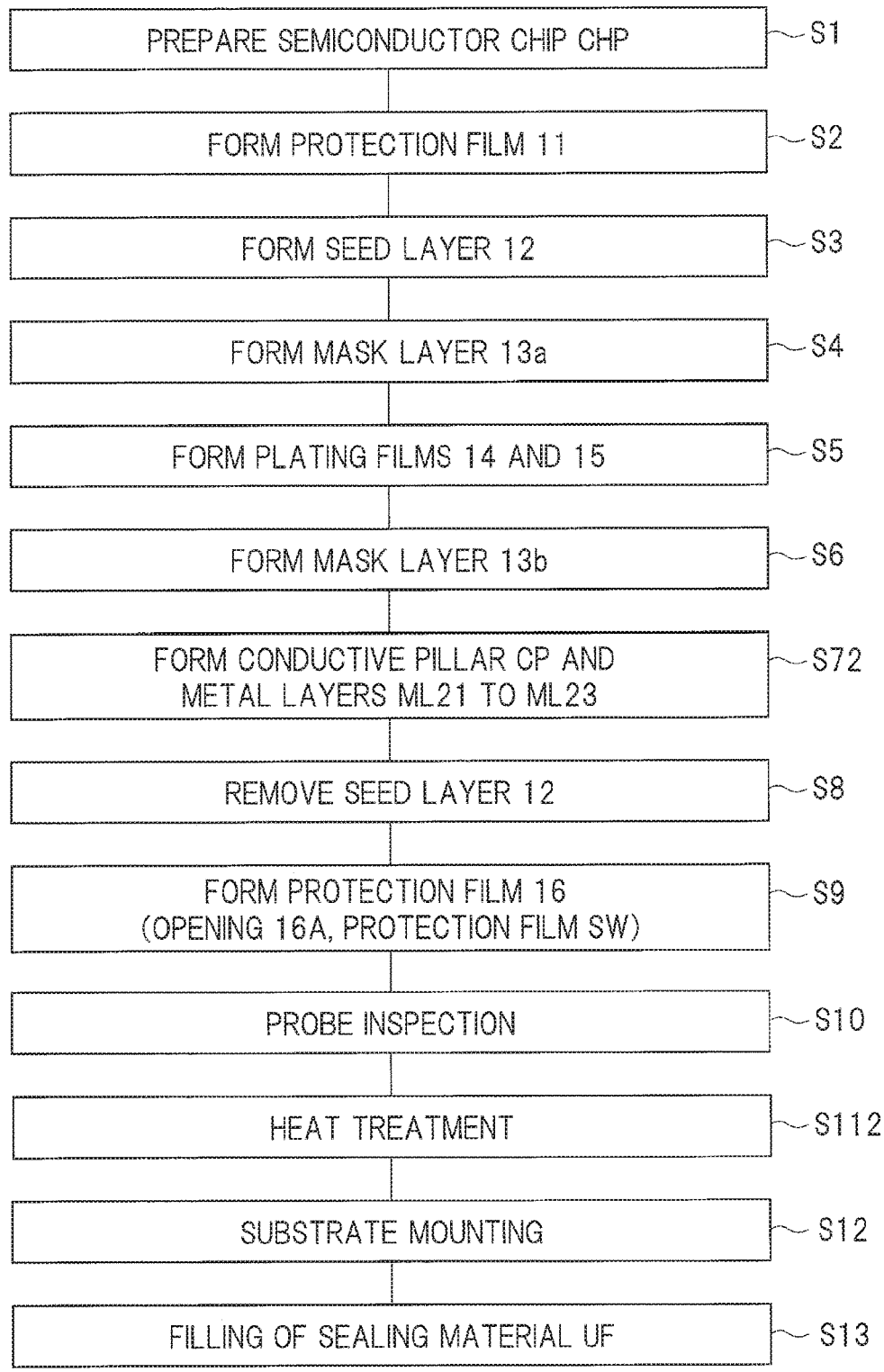
FIG. 22 is a process flow chart illustrating a part of a manufacturing process of a semiconductor device of a second modification example.
Figure 23:
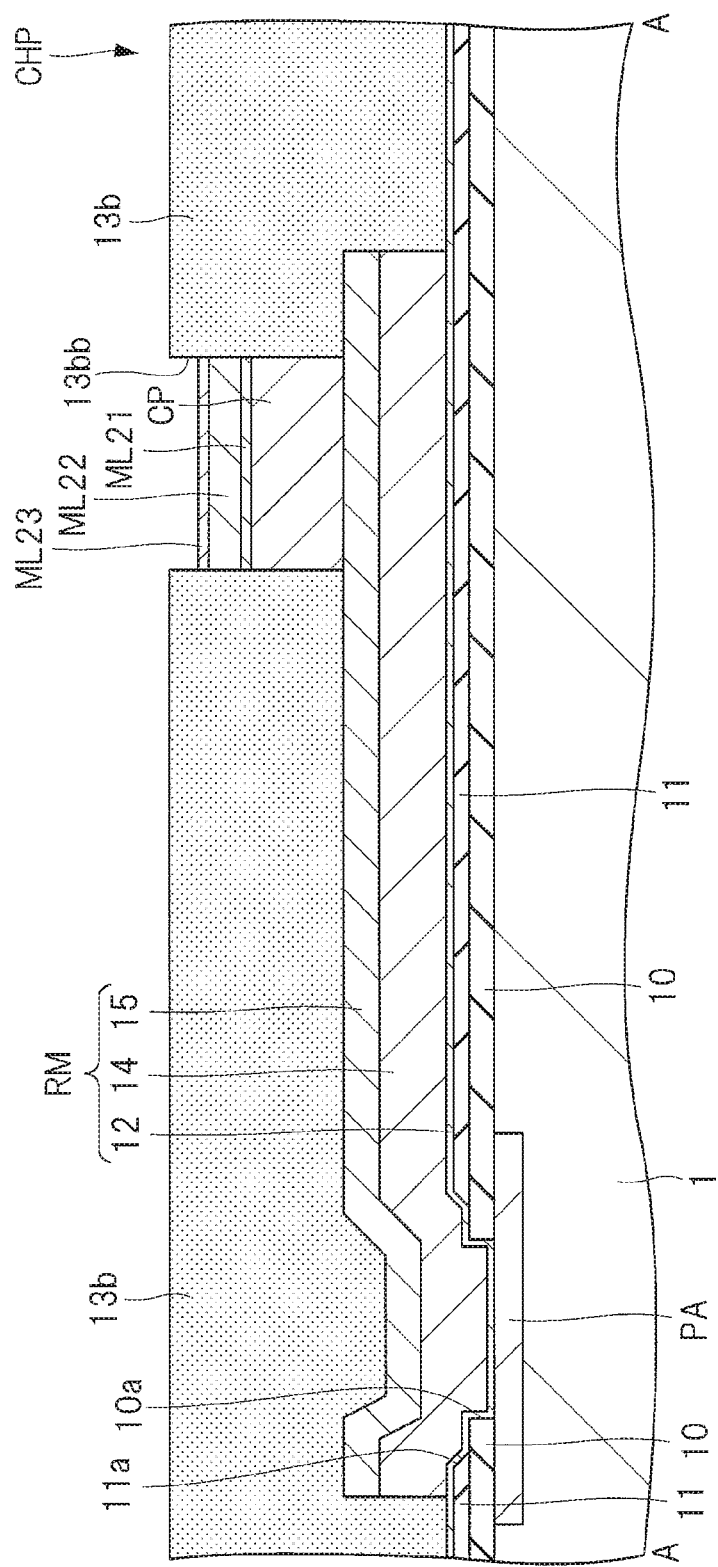
FIG. 23 is a cross-sectional view of a main part during the manufacturing process of the semiconductor device of the second modification example.
Figure 24:
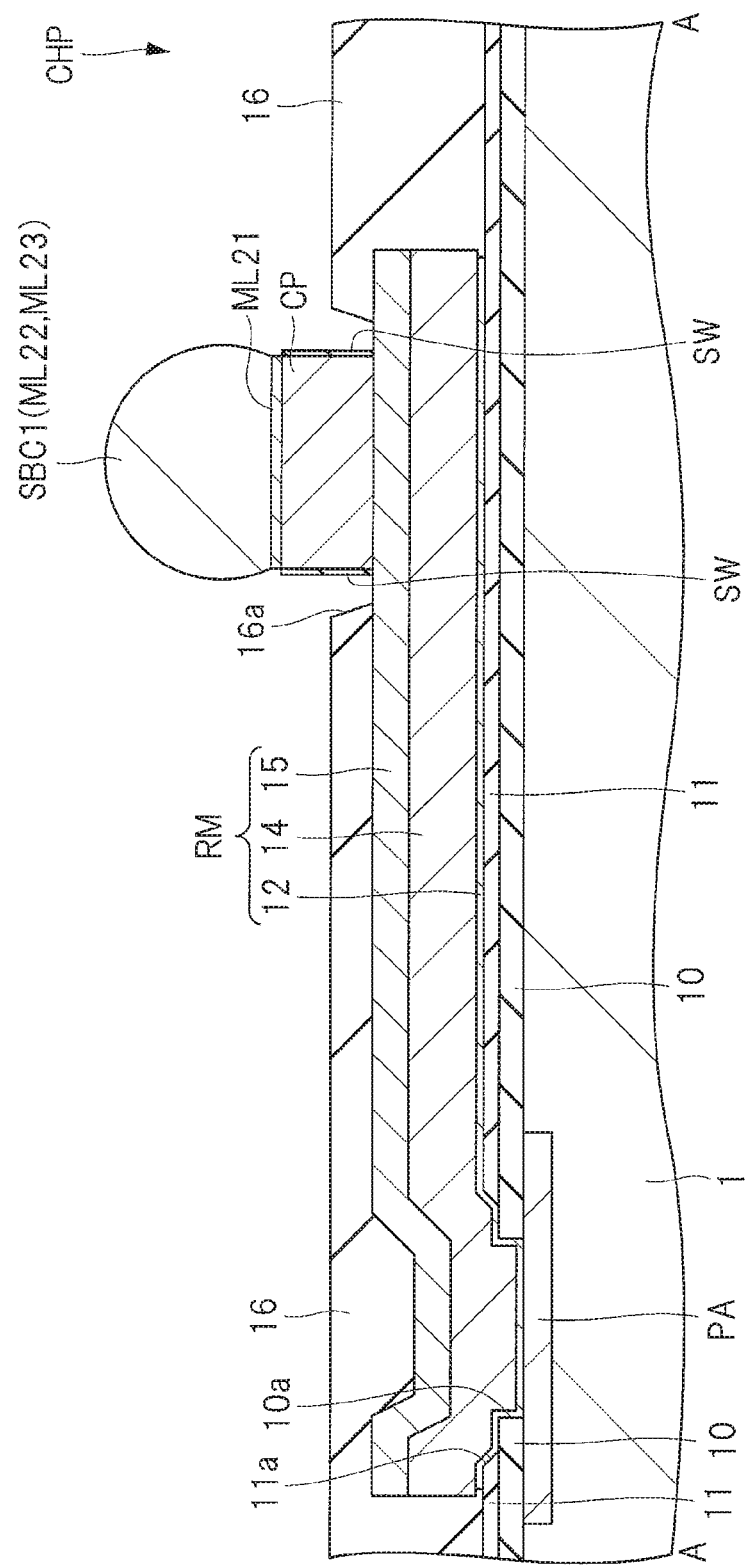
FIG. 24 is a cross-sectional view of a main part during the manufacturing process of the semiconductor device of the second modification example.

FIG. 22 is a process flow chart illustrating a part of a manufacturing process of a semiconductor device of the second modification example. FIGS. 23 and 24 are cross-sectional views of a main part during the manufacturing process of the semiconductor device of the second modification example.

After steps S1 to S6 illustrated in FIG. 22 are performed, step S72 in FIG. 22 is performed. As illustrated in FIG. 23, by electrolytic plating, a copper (Cu) plating film for the conductive pillar CP, and a metal layer ML21 made of a nickel (Ni) plating film, a metal layer ML22 made of a tin-copper alloy ($Sn_{0.5}Cu$) plating film, and a metal layer ML23 made of a silver (Ag) plating film are formed in this order on a part of the upper surface of the conductor layer RM exposed from the mask layer 13b, the part being the inside of the opening 13bb.

After steps S8 and S9 in FIG. 22 are performed, in the probe inspection (step S10), a probe needle is applied to the metal layer ML23 formed over the conductive pillar CP, and the probe inspection is performed.

Next, a heat treatment process is performed (step S112 in FIG. 22). The heat treatment is performed at a temperature of, for example, 300° C. or more. By this heat treatment, as illustrated in FIG. 24, a solder ball electrode SBC1 is formed over the conductive pillar CP via the metal layer ML21. The solder ball electrode SBC1 is an alloy layer of the metal layers ML22 and ML23, and its composition is $Sn_xAg_{0.5}Cu$. Forming a bump structure in the heat treatment process after the performance of the probe inspection on a flat surface allows for contribution to stabilization and facilitation of mounting between the pre-solder on the substrate side and the solder ball electrode SBC1. Furthermore, it is possible to deal with both processes by using a suitable front surface structure without newly adding a soldering process.

Next, steps S12 and S13 in FIG. 22 are performed to complete the semiconductor device of the second modification example.

In the foregoing, the invention made by the inventors of the present invention has been concretely described based on the embodiments. However, it is needless to say that the present invention is not limited to the foregoing embodiments and various modifications and alterations can be made within the scope of the present invention.

What is claimed is:

1. A semiconductor device, comprising:
   a semiconductor substrate;
   a conductor layer formed over the semiconductor substrate and including a first upper surface and a first lower surface;
   a conductive pillar disposed on the first upper surface of the conductor layer and including a second upper surface, a second lower surface, and a sidewall;
   a first insulating film covering the first upper surface of the conductor layer and including an opening which exposes the second upper surface and the sidewall of the conductive pillar;
   a protection film covering the sidewall of the conductive pillar,
      wherein, in a plan view, the opening is wider than the second upper surface and exposes an entire region of the second upper surface, and
      wherein the second lower surface of the conductive pillar is in contact with the first upper surface of the conductor layer in an entire region of the conductive pillar; and
   a second insulating film formed under the conductor layer in such a manner as to overlap with the entire region of the conductive pillar in the plan view,
   wherein, in the plan view, the first upper surface of the conductor layer is exposed from the protection film and the conductive pillar.

2. The semiconductor device according to claim 1, wherein the conductive pillar comprises a metal film mainly comprising copper, and
   wherein the protection film comprises an organic film containing copper.

3. The semiconductor device according to claim 1, further comprising:
   a pad electrode formed over the semiconductor substrate and under the conductor layer,
   wherein the first lower surface of the conductor layer is connected to the pad electrode.

4. The semiconductor device according to claim 1, wherein the conductor layer comprises a seed layer and a copper plating film formed over the seed layer.

5. The semiconductor device according to claim 4, wherein an end of the seed layer recedes from an end of the copper plating film.

6. The semiconductor device according to claim 1, wherein the first insulating film and the second insulating film comprise a polyimide film.

7. The semiconductor device according to claim 1, further comprising:
- a barrier layer covering the second upper surface of the conductive pillar,
- wherein the barrier layer comprises a noble metal film.

8. The semiconductor device according to claim 1, wherein a bottom surface of the conductive pillar abuts the first upper surface of the conductor layer, and
- wherein the protection film abuts the sidewall of the conductive pillar.

9. The semiconductor device according to claim 1, wherein, in the plan view, an entirety of the second upper surface of the conductive pillar is located inside the opening.

10. The semiconductor device according to claim 1, wherein, in an area of the opening extending between the protection film and the first insulating film, the first upper surface of the conductor layer is exposed.

11. The semiconductor device according to claim 1, wherein, in the plan view, the protection film is spaced apart from the first insulating film.

12. The semiconductor device according to claim 1, wherein the conductor layer comprises:
- a first plating film comprising the first upper surface;
- a seed layer comprising the first lower surface; and
- a second plating film disposed between the first plating film and the seed layer.

13. The semiconductor device according to claim 12, wherein the second plating film abuts the first plating film and the seed layer.

14. The semiconductor device according to claim 12, wherein the seed layer includes an undercut recessed relative to the second plating film in a shape receded inward from an end portion of the second plating film.

* * * * *